United States Patent
Fujii et al.

(10) Patent No.: US 9,805,927 B2
(45) Date of Patent: Oct. 31, 2017

(54) NONVOLATILE SEMICONDUCTOR MEMORY DEVICE

(71) Applicant: Toshiba Memory Corporation, Minato-ku (JP)

(72) Inventors: Shosuke Fujii, Kuwana (JP); Kiwamu Sakuma, Yokkaichi (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/134,969

(22) Filed: Apr. 21, 2016

(65) Prior Publication Data

US 2017/0033118 A1    Feb. 2, 2017

(30) Foreign Application Priority Data

Jul. 31, 2015   (JP) ................... 2015-152164

(51) Int. Cl.
*H01L 27/115*   (2017.01)
*H01L 21/02*   (2006.01)
(Continued)

(52) U.S. Cl.
CPC .. *H01L 21/02238* (2013.01); *H01L 21/02164* (2013.01); *H01L 21/02271* (2013.01);
(Continued)

(58) Field of Classification Search
CPC ........... H01L 27/11551; H01L 29/7842; H01L 29/7843
See application file for complete search history.

(56) References Cited

U.S. PATENT DOCUMENTS 7,180,143 B2   2/2007   Kanegae et al.
7,352,018 B2   4/2008   Specht et al.
(Continued)

FOREIGN PATENT DOCUMENTS

| JP | 2008-78404 | 4/2008 |
|---|---|---|
| JP | 2008-218727 | 9/2008 |
| JP | 4449374 | 4/2010 |
| WO | WO 2010/004047 A1 | 1/2010 |
| WO | WO 2011/114502 A1 | 9/2011 |

OTHER PUBLICATIONS

R. Arghavani, et al., "Strain Engineering to Improve Data Retention Time in Nonvolatile Memory", IEEE Transactions on Electron Devices, vol. 54, 2007, 3 pgs.
(Continued)

*Primary Examiner* — Allison P Bernstein
(74) *Attorney, Agent, or Firm* — Oblon, McClelland, Maier & Neustadt, L.L.P.

(57) ABSTRACT

According to one embodiment, a nonvolatile semiconductor memory device includes a first structure having a first insulating layer, a semiconductor layer, and a second insulating layer stacked in this order in a first direction, the first structure extending in a second direction, memory cells provided on a surface of the semiconductor layer facing in a third direction, and connected in series in the second direction, and a third insulating layer contacting at least one of first and second end portions of the first structure in the second direction and not covering at least a part of an area between the first and second end portions. A lattice spacing of semiconductor atoms in the semiconductor layer in the second direction is larger than a lattice spacing of the semiconductor atoms in the semiconductor layer in the first direction.

7 Claims, 25 Drawing Sheets

(51) Int. Cl.

| | |
|---|---|
| *H01L 27/11524* | (2017.01) |
| *H01L 27/1157* | (2017.01) |
| *H01L 29/78* | (2006.01) |
| *H01L 21/3105* | (2006.01) |
| *H01L 21/311* | (2006.01) |
| *H01L 21/3065* | (2006.01) |
| *H01L 21/308* | (2006.01) |
| *H01L 21/306* | (2006.01) |
| *H01L 27/11519* | (2017.01) |
| *H01L 27/11548* | (2017.01) |
| *H01L 27/11551* | (2017.01) |
| *H01L 27/11565* | (2017.01) |
| *H01L 27/11575* | (2017.01) |
| *H01L 27/11578* | (2017.01) |

(52) U.S. Cl.
CPC ...... *H01L 21/3065* (2013.01); *H01L 21/3081* (2013.01); *H01L 21/30604* (2013.01); *H01L 21/31055* (2013.01); *H01L 21/31116* (2013.01); *H01L 21/31144* (2013.01); *H01L 27/1157* (2013.01); *H01L 27/11519* (2013.01); *H01L 27/11524* (2013.01); *H01L 27/11548* (2013.01); *H01L 27/11551* (2013.01); *H01L 27/11565* (2013.01); *H01L 27/11575* (2013.01); *H01L 27/11578* (2013.01); *H01L 29/7843* (2013.01); *H01L 21/02255* (2013.01)

(56) References Cited

U.S. PATENT DOCUMENTS

| | | |
|---|---|---|
| 7,382,018 B2 | 6/2008 | Kim et al. |
| 7,851,849 B2 | 12/2010 | Kiyotoshi |
| 7,867,831 B2 | 1/2011 | Shin et al. |
| 8,932,915 B2 * | 1/2015 | Saitoh .................. B82Y 10/00 438/151 |
| 9,331,093 B2 * | 5/2016 | Rabkin ............. H01L 27/11582 |
| 2008/0073635 A1 | 3/2008 | Kiyotoshi et al. |
| 2008/0153236 A1 | 6/2008 | Cheng et al. |
| 2008/0258203 A1 | 10/2008 | Happ et al. |
| 2008/0259687 A1 | 10/2008 | Specht et al. |
| 2010/0006919 A1 | 1/2010 | Kim et al. |
| 2010/0044778 A1 | 2/2010 | Seol et al. |
| 2010/0172182 A1 | 7/2010 | Seol et al. |
| 2010/0226195 A1 | 9/2010 | Lue |
| 2010/0308398 A1 | 12/2010 | Shin et al. |
| 2010/0327323 A1 | 12/2010 | Choi |
| 2011/0169067 A1 | 7/2011 | Ernst et al. |
| 2013/0015519 A1 | 1/2013 | Fujii et al. |

OTHER PUBLICATIONS

Chun-Hsiung Hung, et al, "A Highly Scalable Vertical Gate (VG) 3D NAND Flash with Robust Program Disturb Immunity Using a Novel PN Diode Decoding Structure", Symposium on VLSI Technology Digest of Technical Papers, 2011, 2 pgs.

* cited by examiner

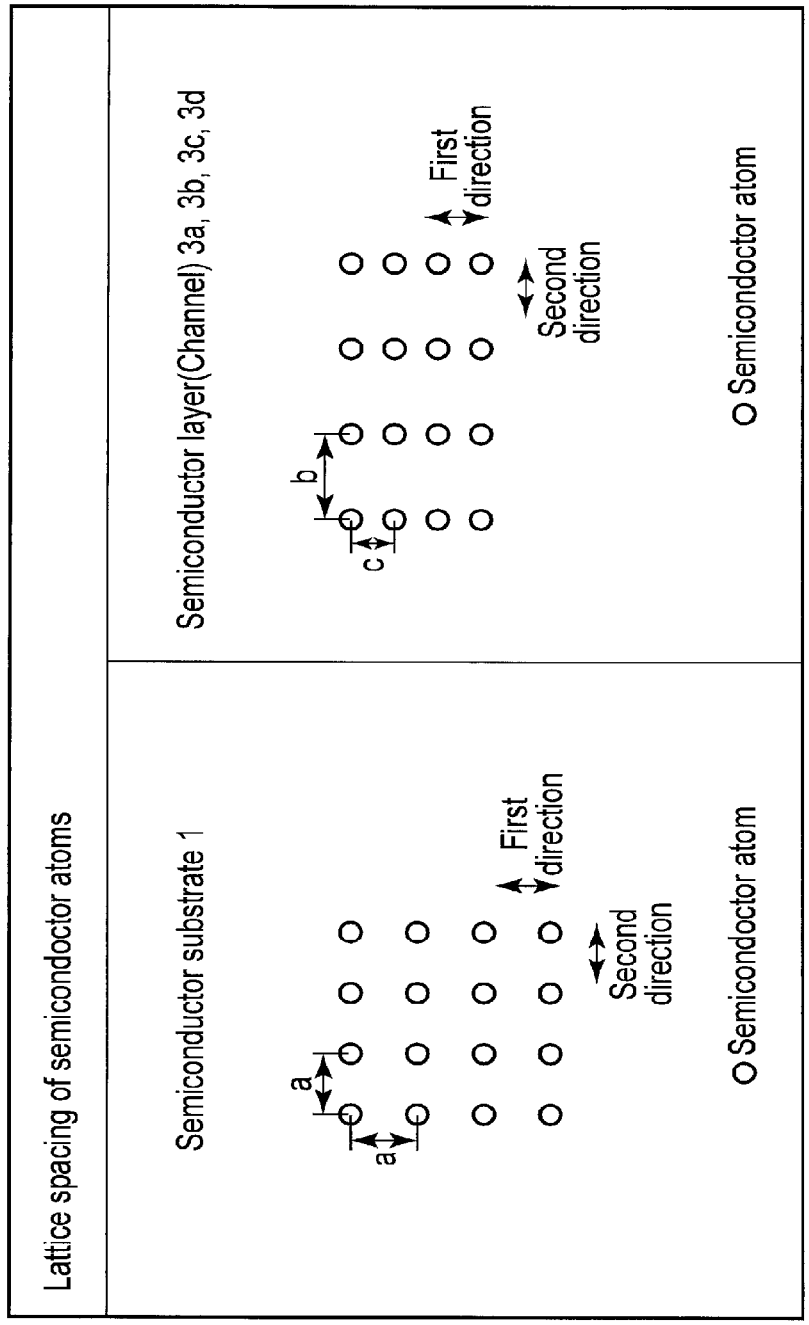
F I G. 3

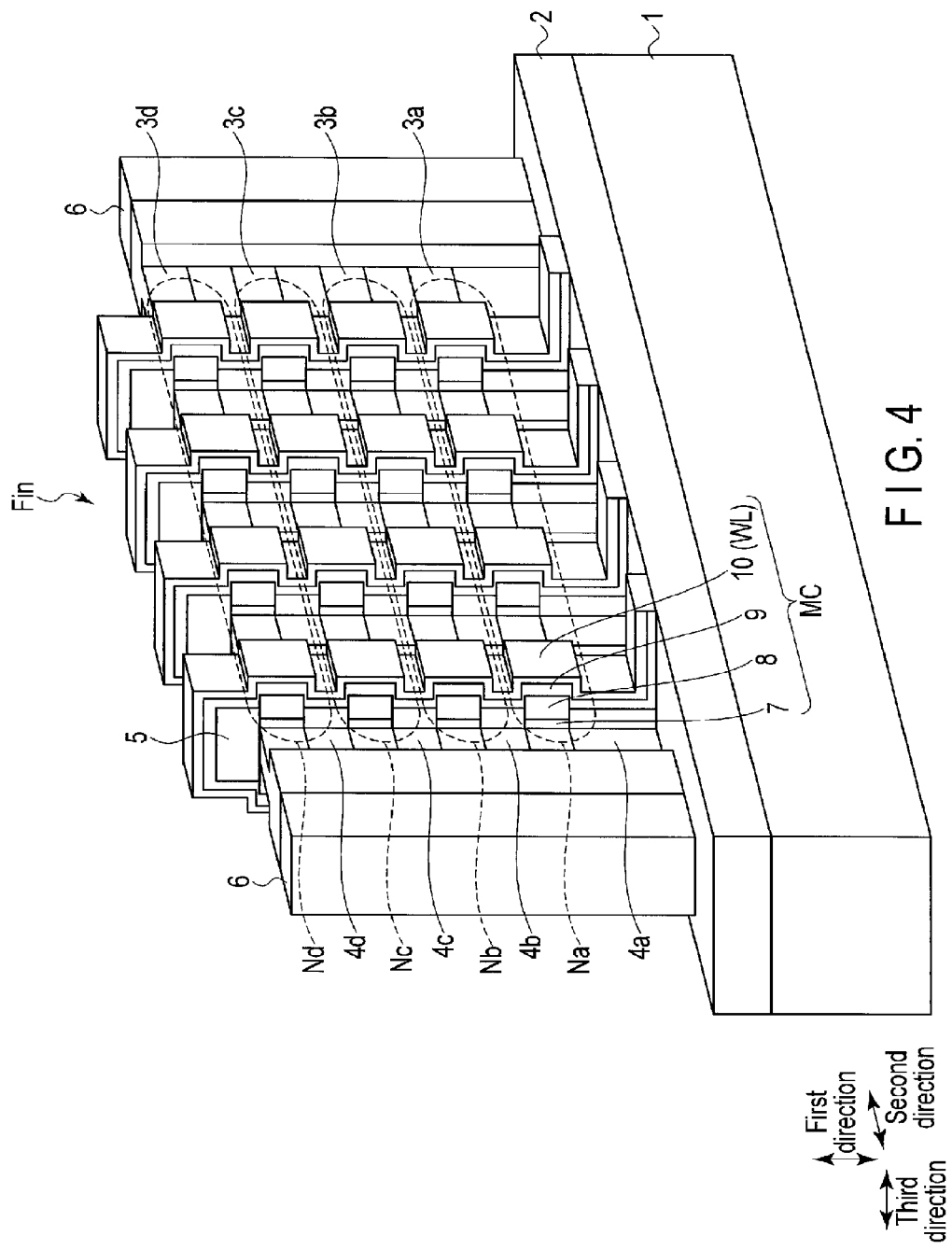
F I G. 4

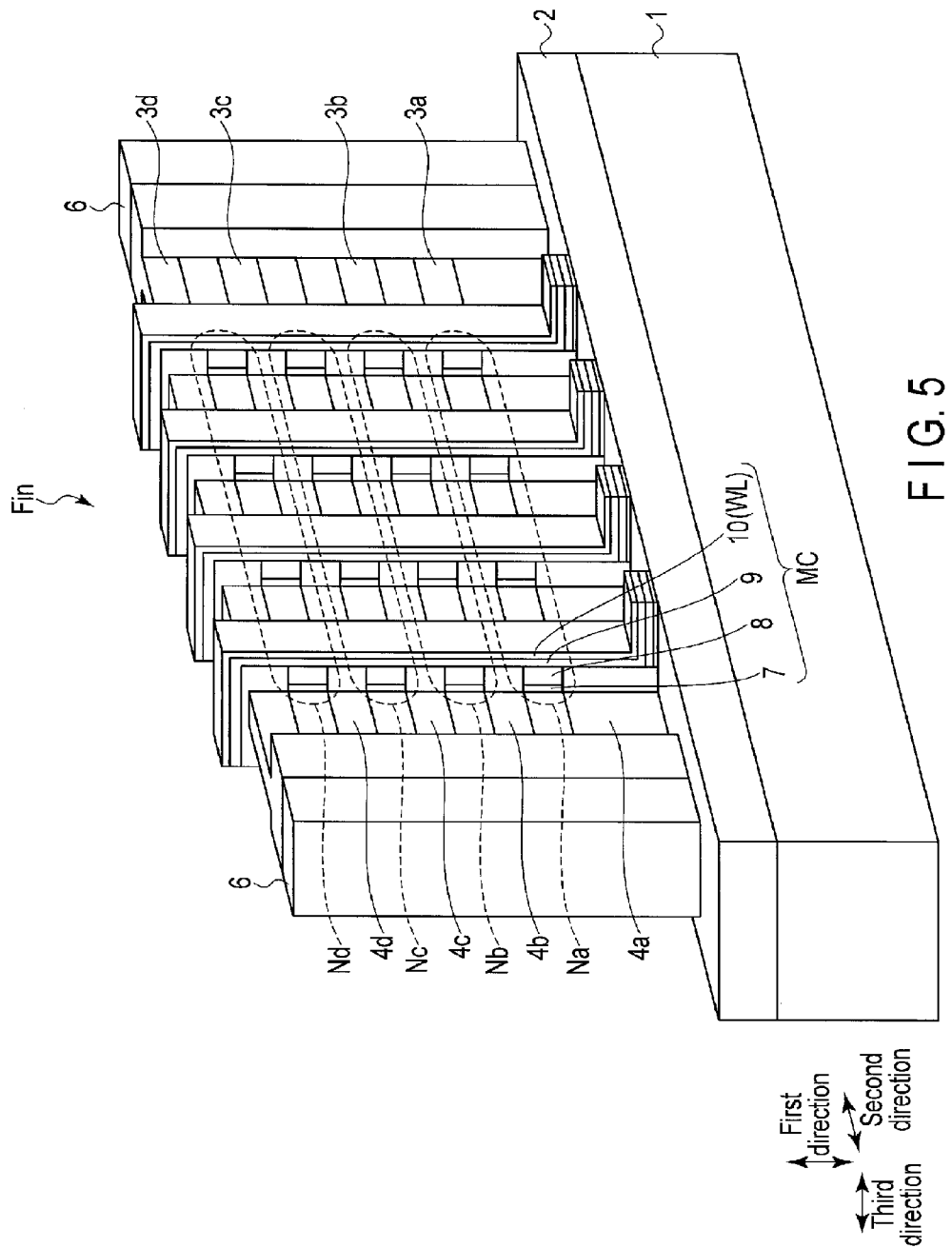
F I G. 5

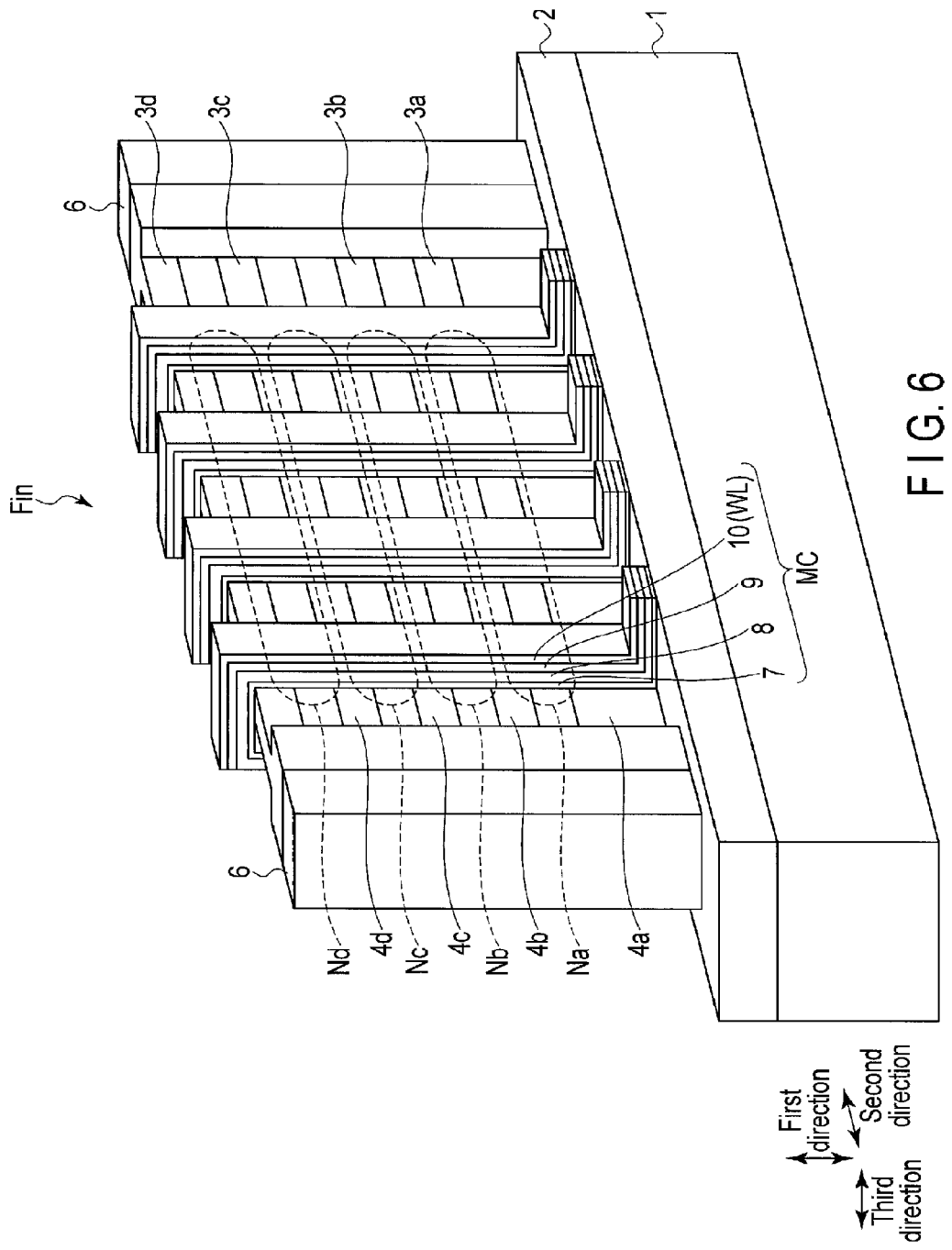
F I G. 6

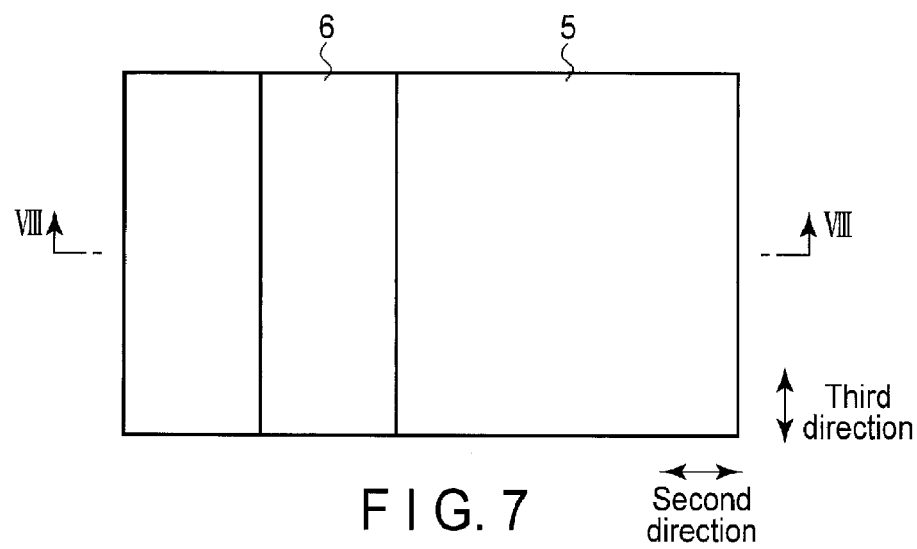
F I G. 7
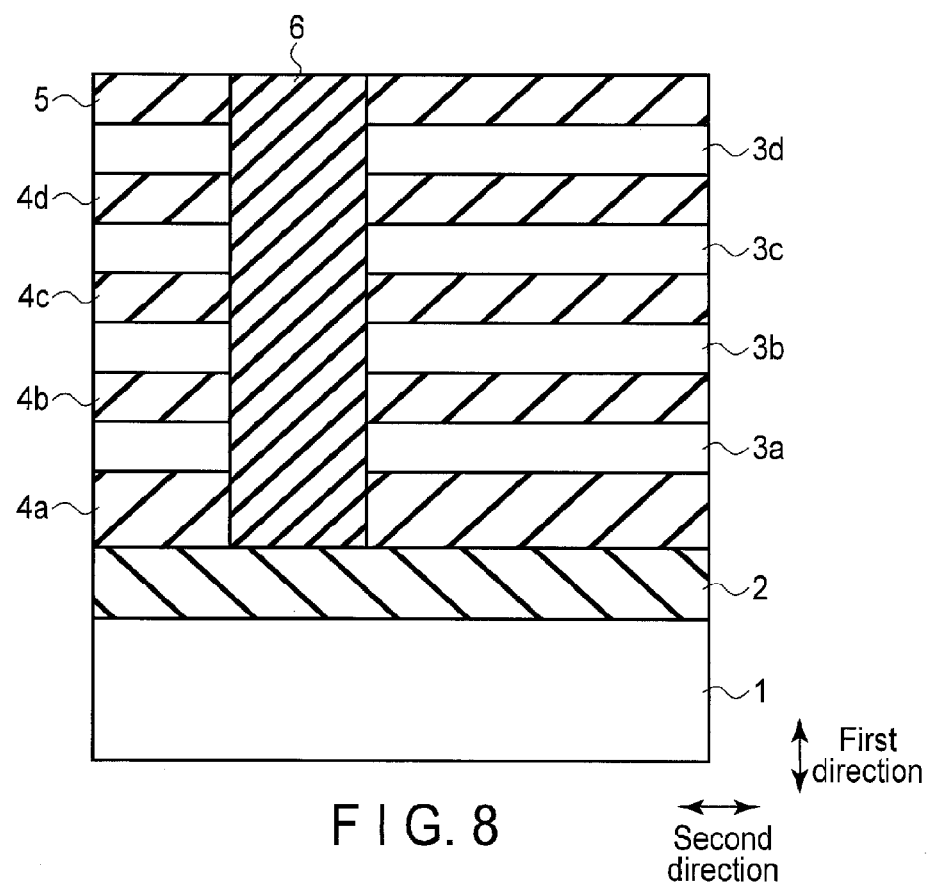
F I G. 8

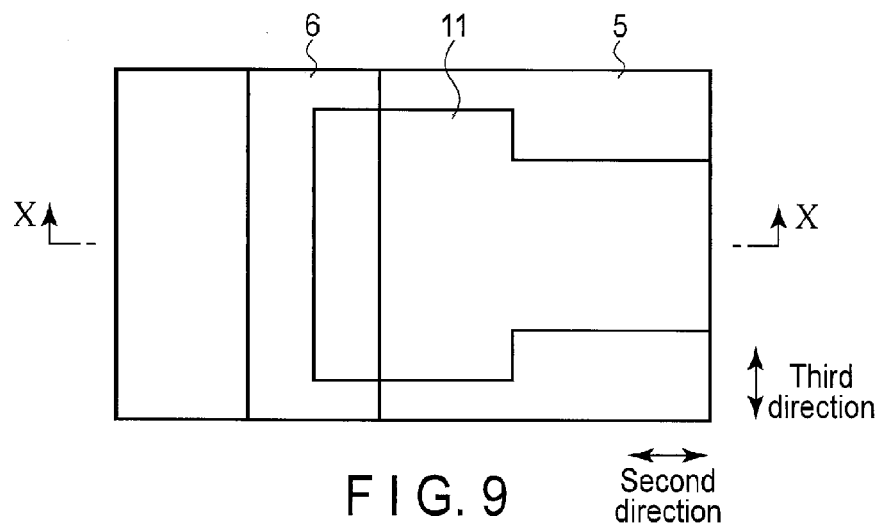
F I G. 9
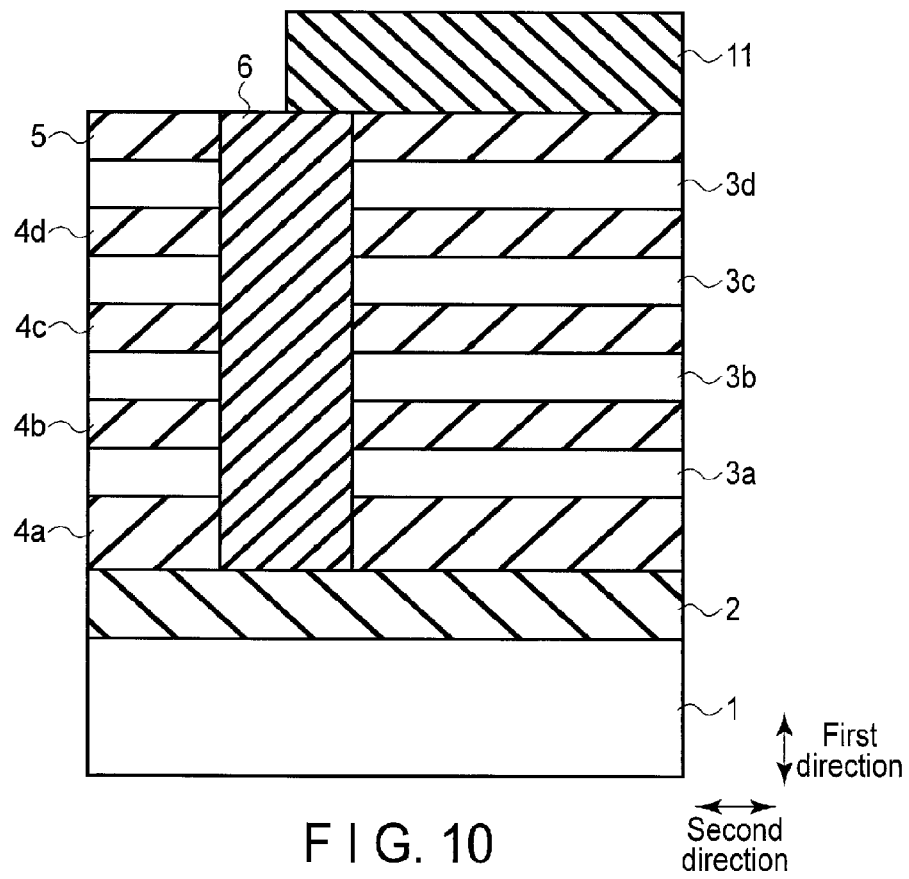
F I G. 10

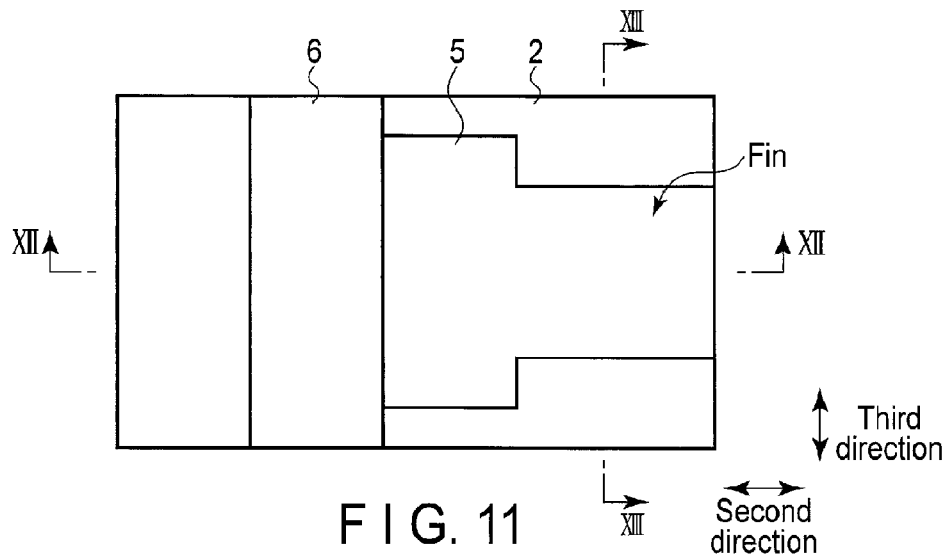
F I G. 11
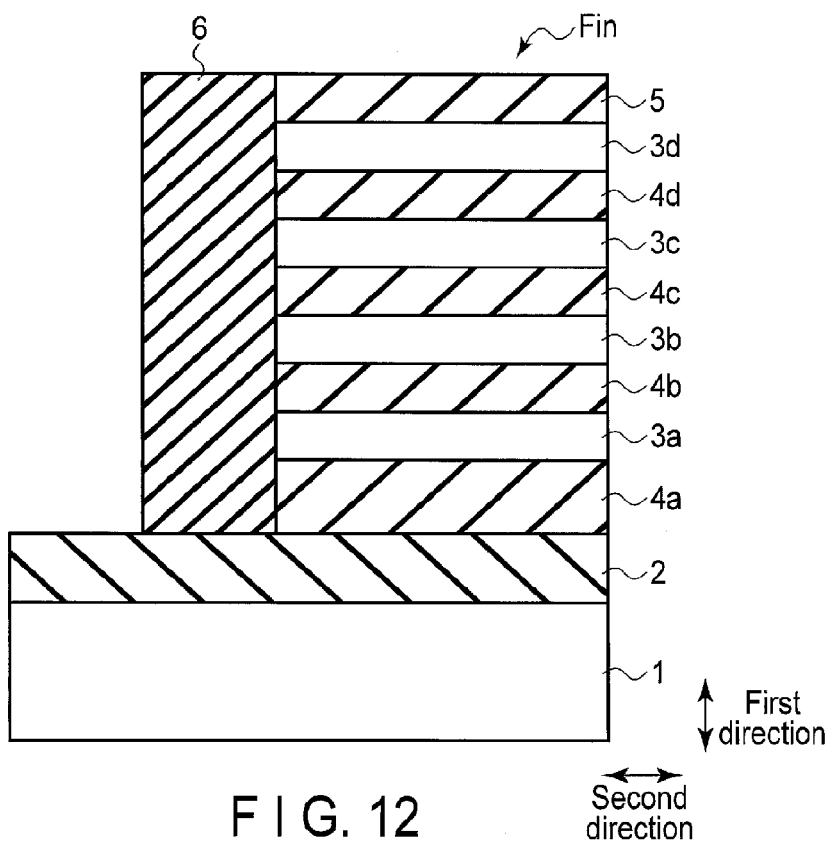
F I G. 12

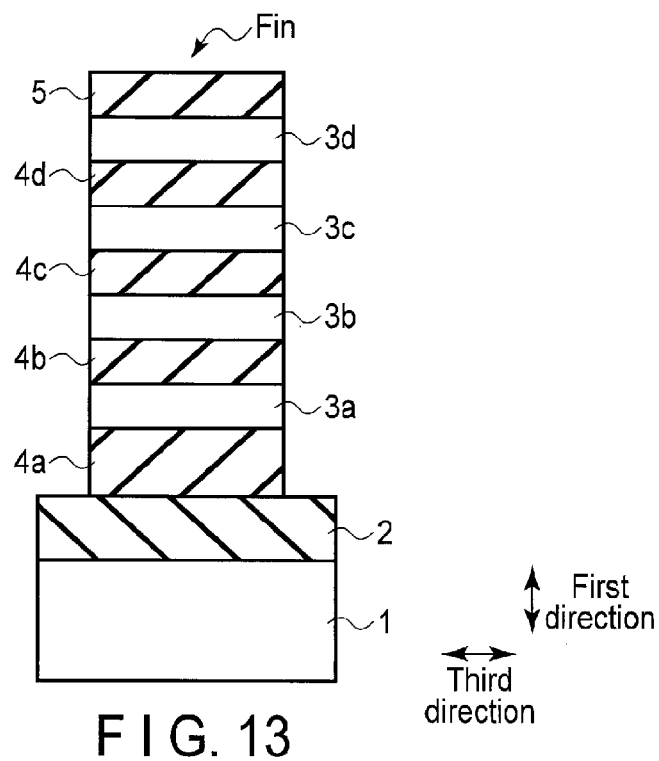
F I G. 13
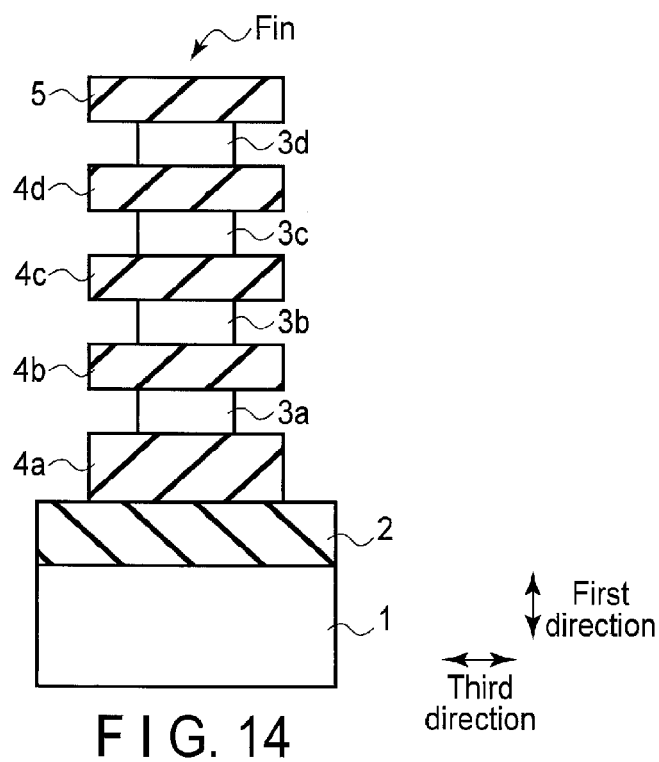
F I G. 14

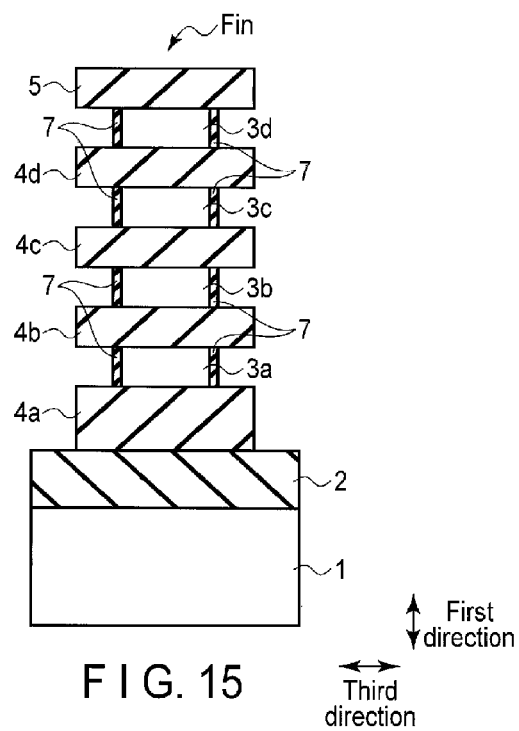
F I G. 15
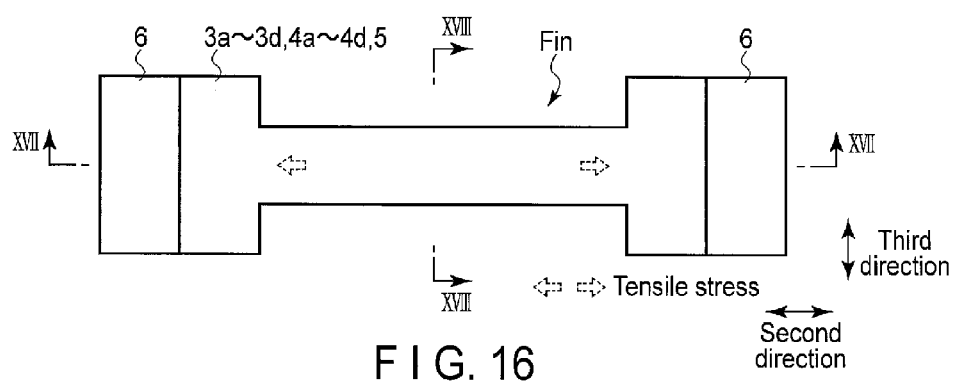
F I G. 16

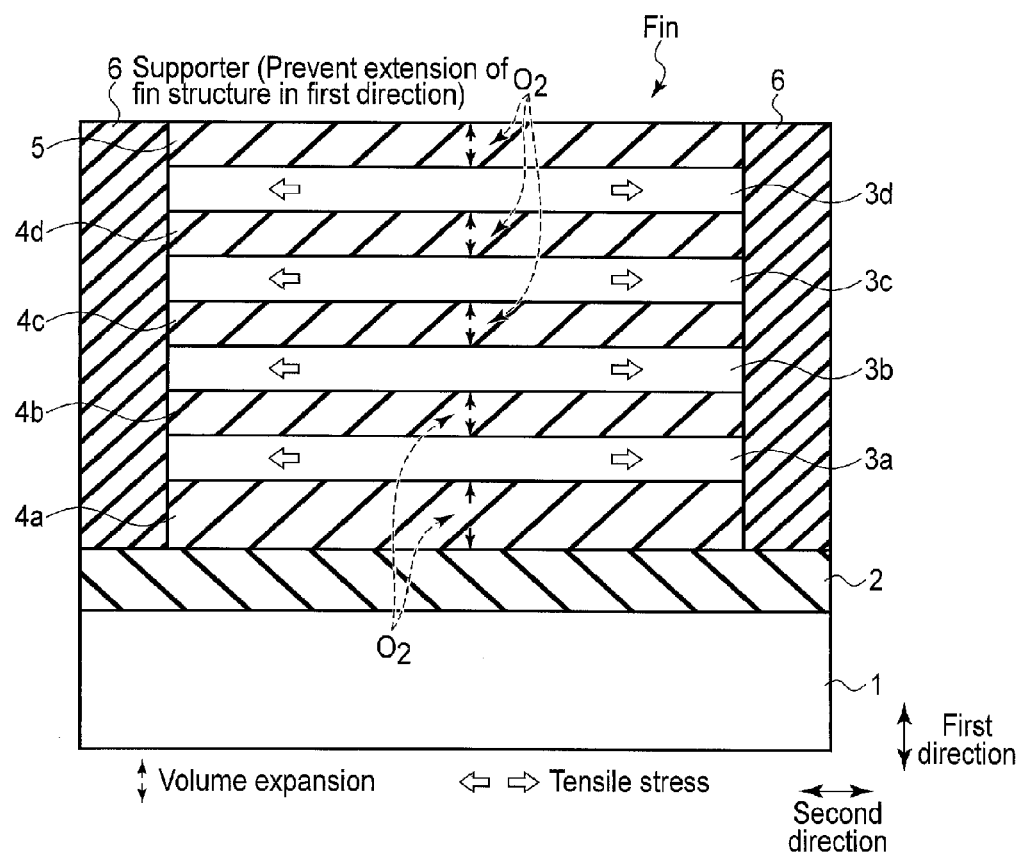
F I G. 17

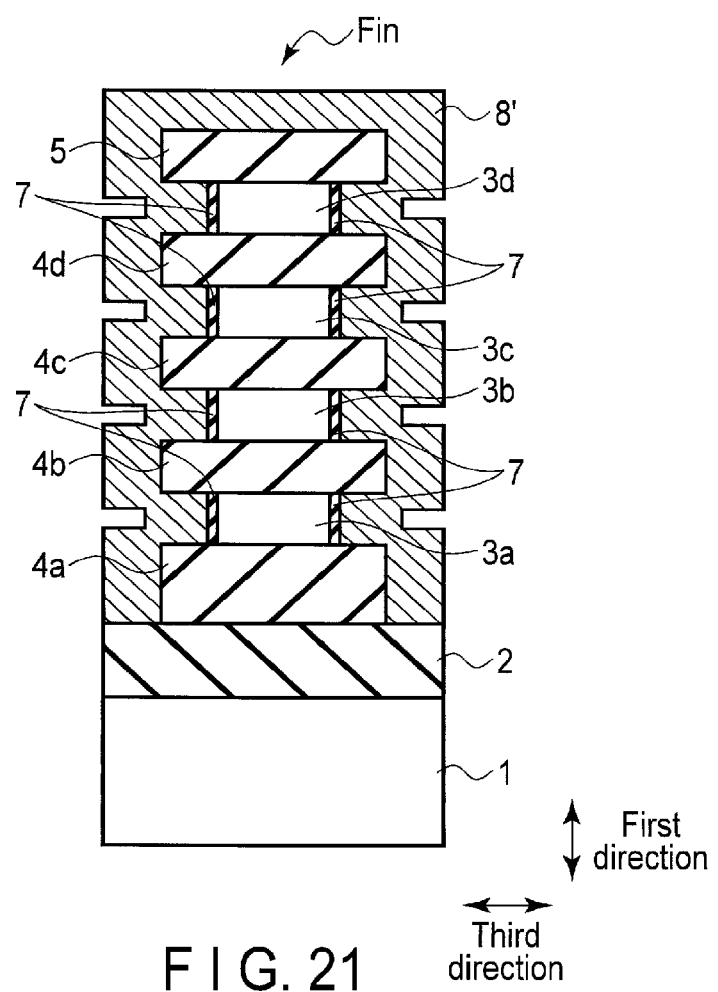
F I G. 21

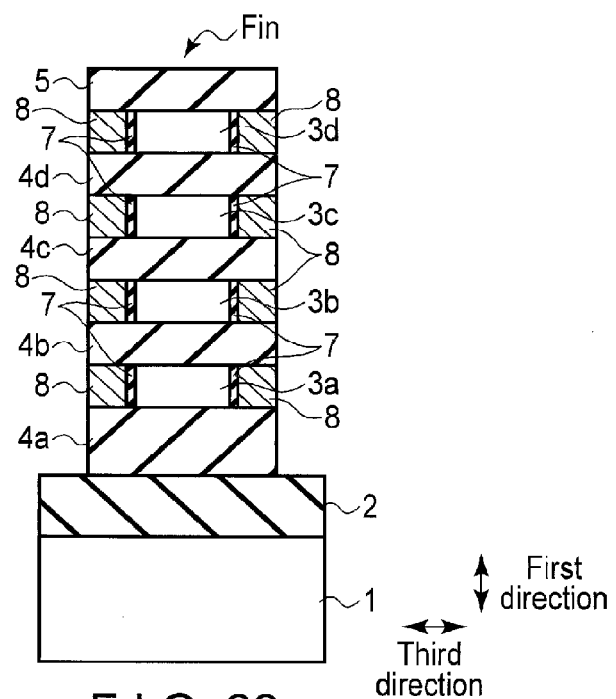
F I G. 22
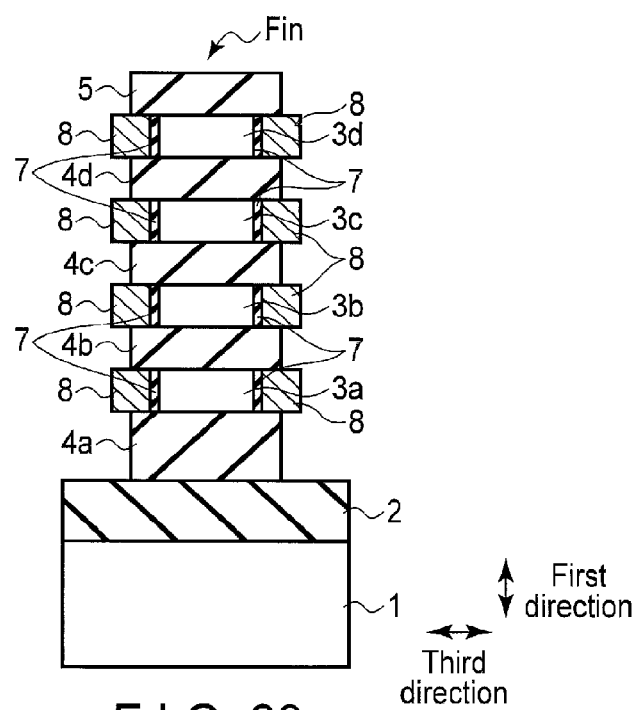
F I G. 23

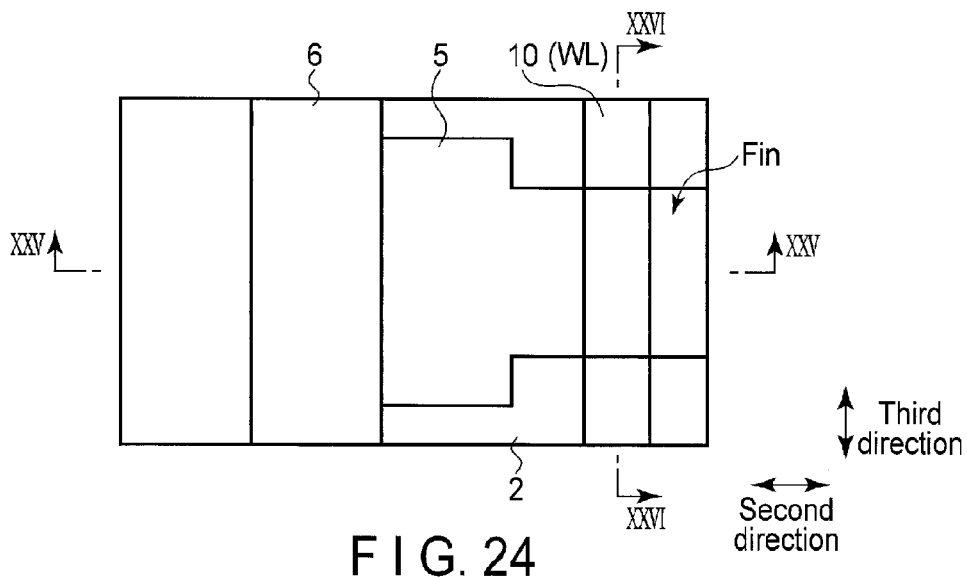
F I G. 24
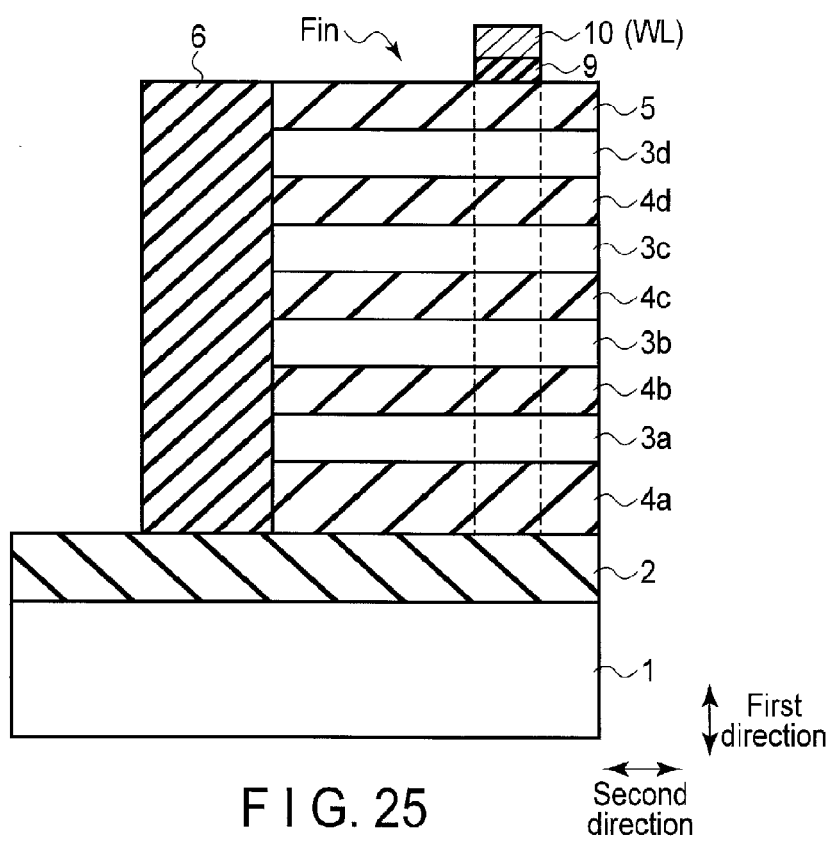
F I G. 25

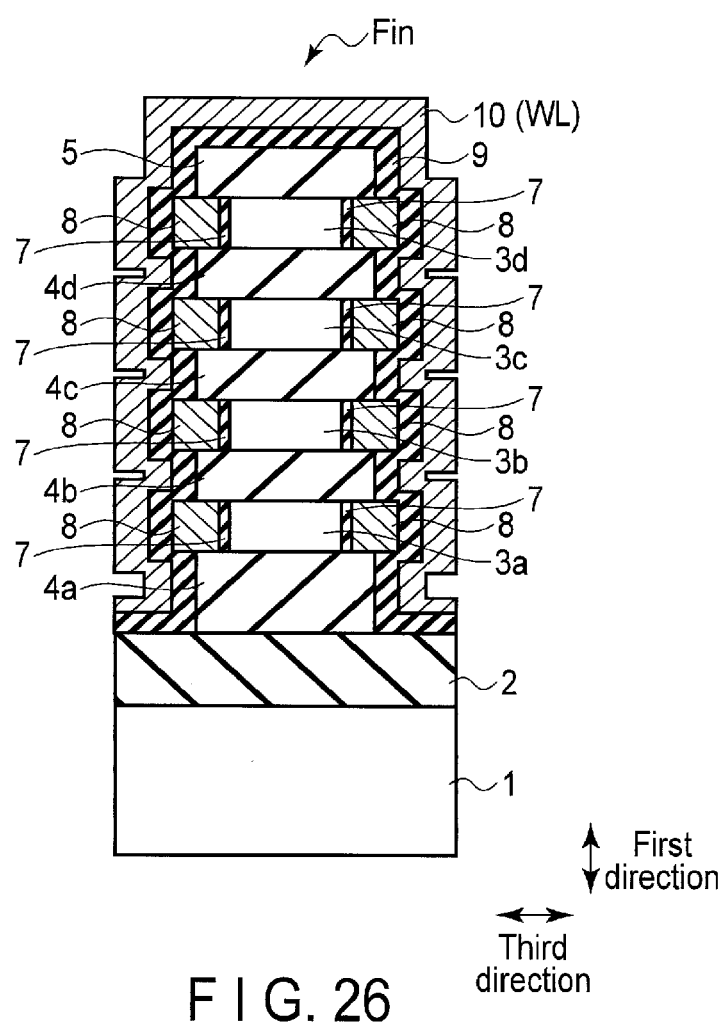
F I G. 26

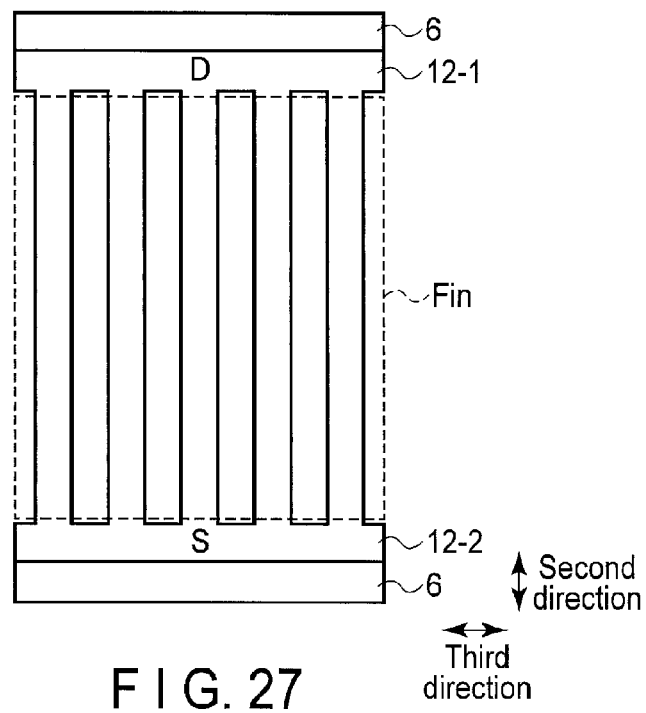
F I G. 27
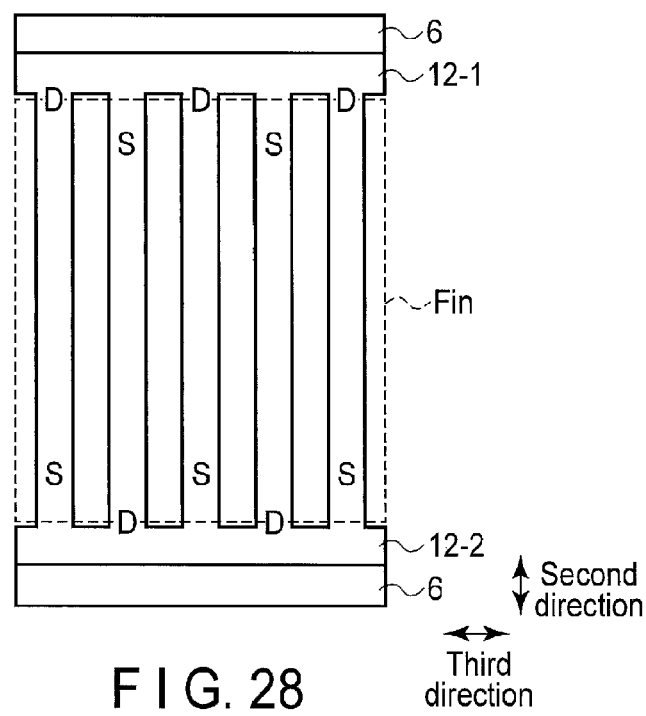
F I G. 28

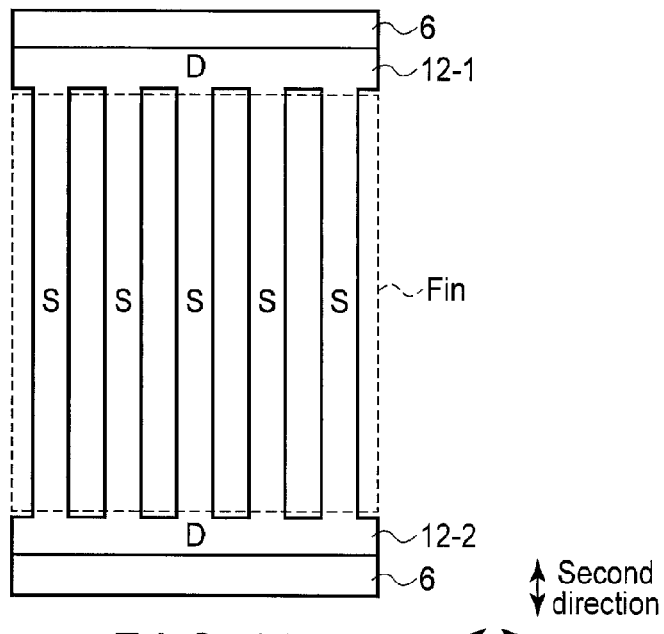
F I G. 29
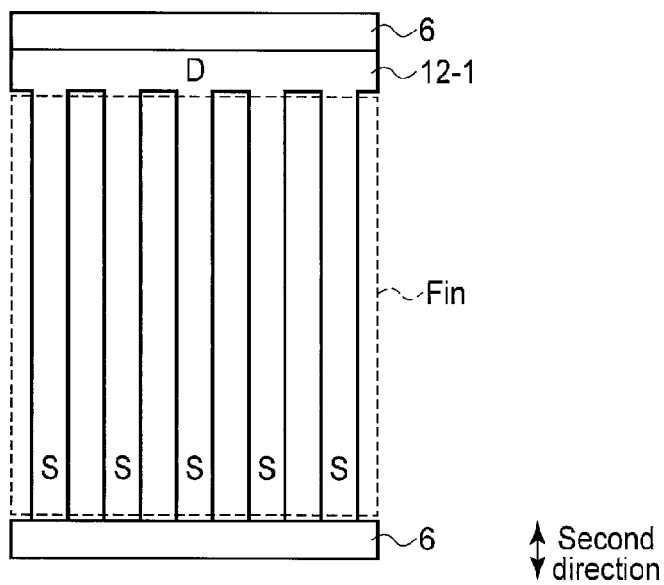
F I G. 30

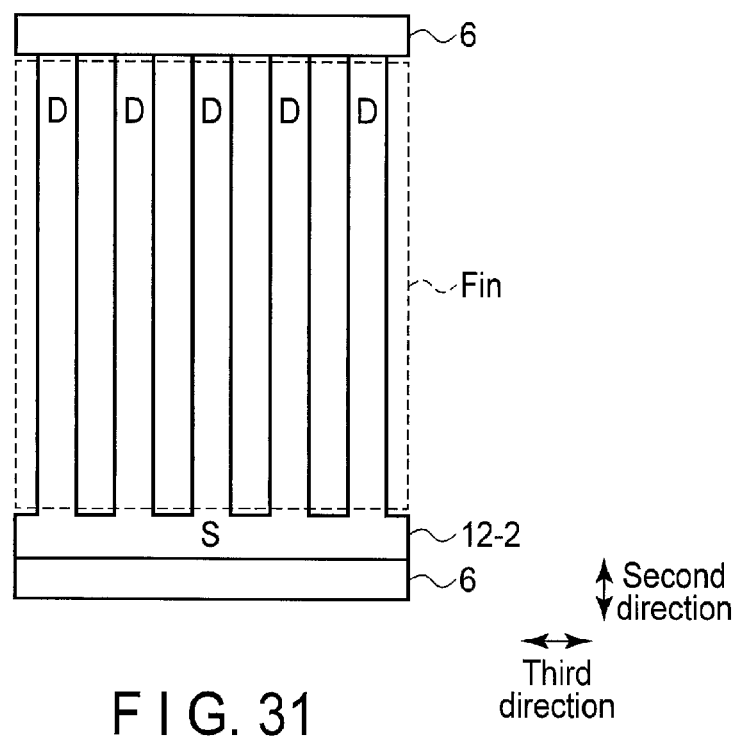
F I G. 31

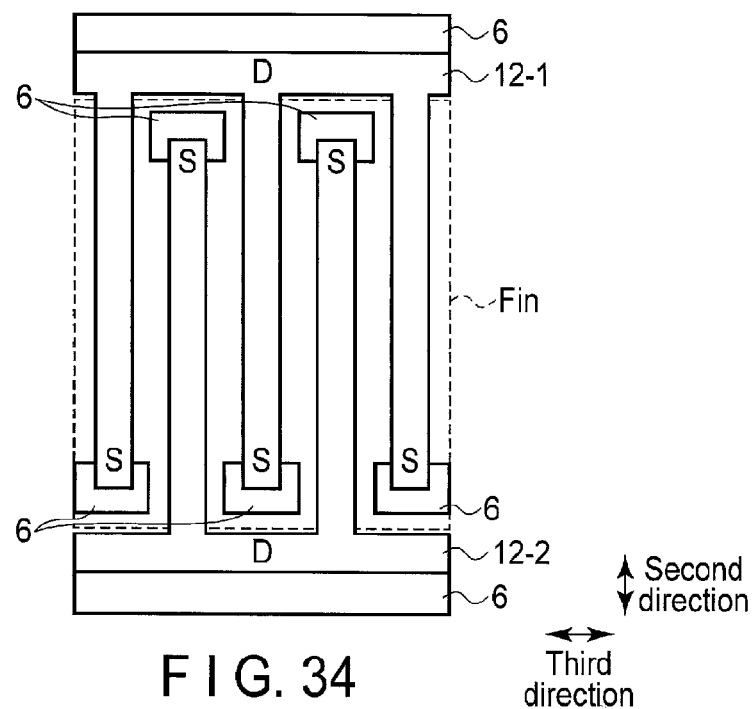
F I G. 34
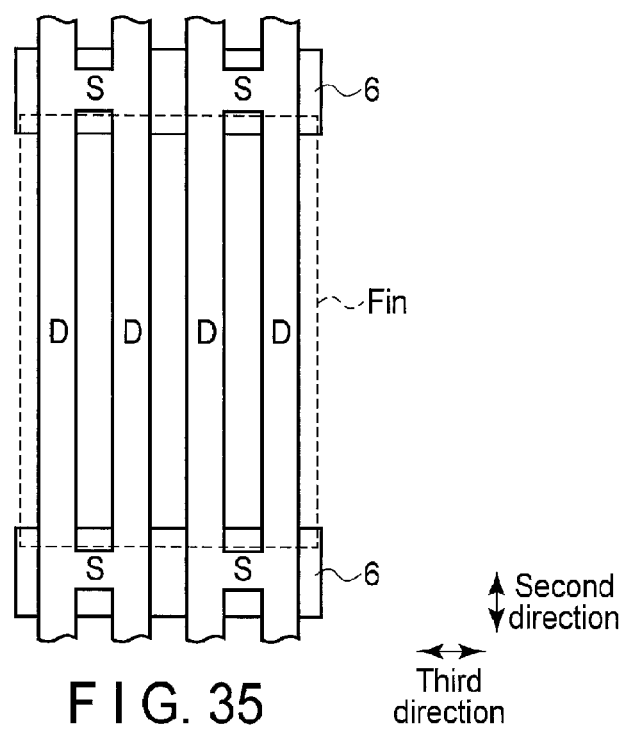
F I G. 35

NONVOLATILE SEMICONDUCTOR MEMORY DEVICE

CROSS-REFERENCE TO RELATED APPLICATIONS

This application is based upon and claims the benefit of priority from Japanese Patent Application No. 2015-152164, filed Jul. 31, 2015, the entire contents of which are incorporated herein by reference.

FIELD

Embodiments described herein relate generally to a nonvolatile semiconductor memory device.

BACKGROUND

NAND flash memories are widely used as memory devices for large-volume data. Currently, the reduction in cost per bit and the increase in capacity are being promoted by miniaturizing memory elements, and further progress in miniaturization in future is required. However, to further miniaturize the flash memories, there are many problems to be solved, such as the development of a lithographic technique, a short channel effect, interelement interference, and the control of variations in elements. Thus, it is highly likely that memory density cannot be continuously improved in future by merely developing a technique of miniaturization in a plane.

Therefore, in recent years, to improve the degree of integration of memory cells, developments for switching its structure from a conventional two-dimensional (planar) structure to a three-dimensional (solid) structure have been made, and various three-dimensional nonvolatile semiconductor memory devices have been proposed. A vertical-gate (VG) semiconductor memory structure, which is one of these, comprises semiconductor layers (channels) on a semiconductor substrate, and memory cells (for example, NAND cells) are provided in each semiconductor.

However, the semiconductor layers as channels become thinner and longer as the degree of integration of the memory cells is improved, and there has been a problem that the on-state current of the memory cells decreases because of an increase in channel resistance. This problem comes to the fore when polycrystalline materials (for example, polycrystalline silicon) are used as the semiconductor layers.

BRIEF DESCRIPTION OF THE DRAWINGS

FIG. 3 is a diagram showing a lattice spacing of semiconductor atoms.

FIG. 4 to FIG. 6 are perspective views showing a second embodiment of the nonvolatile semiconductor memory device.

FIG. 7 is a plan view showing a method of manufacturing a structure of FIG. 4.

FIG. 8 is a sectional view along line VIII-VIII of FIG. 7.

FIG. 9 is a plan view showing the method of manufacturing the structure of FIG. 4.

FIG. 10 is a sectional view along line X-X of FIG. 9.

FIG. 11 is a diagram showing the method of manufacturing the structure of FIG. 4.

FIG. 12 is a sectional view along line XII-XII of FIG. 11.

FIG. 13 is a sectional view along line XIII-XIII of FIG. 11.

FIG. 14 and FIG. 15 are sectional views showing the method of manufacturing the structure of FIG. 4.

FIG. 16 is a plan view explaining a mechanism of occurrence of tensile stress.

FIG. 17 is a sectional view along line XVII-XVII of FIG. 16.

FIG. 21 to FIG. 23 are sectional views showing the method of manufacturing the structure of FIG. 4.

FIG. 24 is a plan view showing the method of manufacturing the structure of FIG. 4.

FIG. 25 is a sectional view along line XXV-XXV of FIG. 24.

FIG. 26 is a sectional view along line XXVI-XXVI of FIG. 24.

FIG. 27 to FIG. 35 are plan views showing a third embodiment of the nonvolatile semiconductor memory device.

DETAILED DESCRIPTION

In general, according to one embodiment, a nonvolatile semiconductor memory comprises: a first structure including a first insulating layer, a semiconductor layer, and a second insulating layer stacked in this order in a first direction, the first structure extending in a second direction crossing the first direction; memory cells provided on a surface of the semiconductor layer facing in a third direction crossing the first and second directions, and connected in series in the second direction; and a third insulating layer contacting at least one of first and second end portions of the first structure in the second direction and not covering at least a part of an area between the first and second end portions. A lattice spacing of semiconductor atoms in the semiconductor layer in the second direction is larger than a lattice spacing of the semiconductor atoms in the semiconductor layer in the first direction.

Embodiments will be hereinafter described with reference to the accompanying drawings.

First Embodiment

Figure 1:
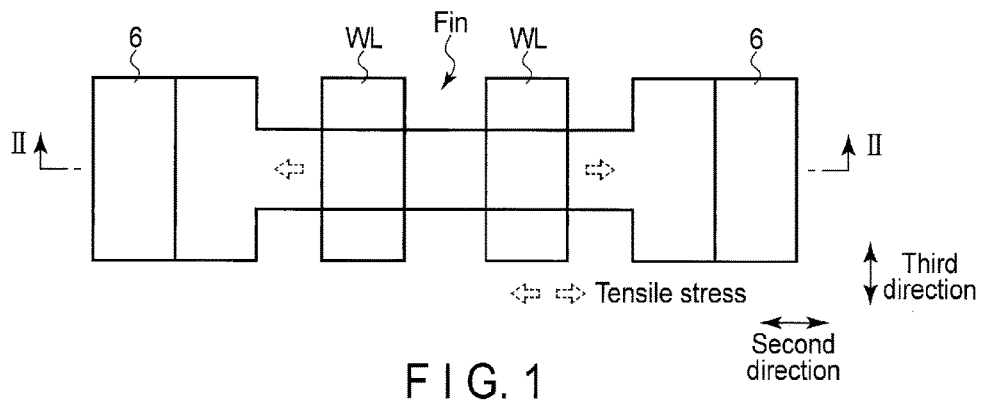
FIG. 1 is a plan view showing a first embodiment of a nonvolatile semiconductor memory device.
Figure 2:
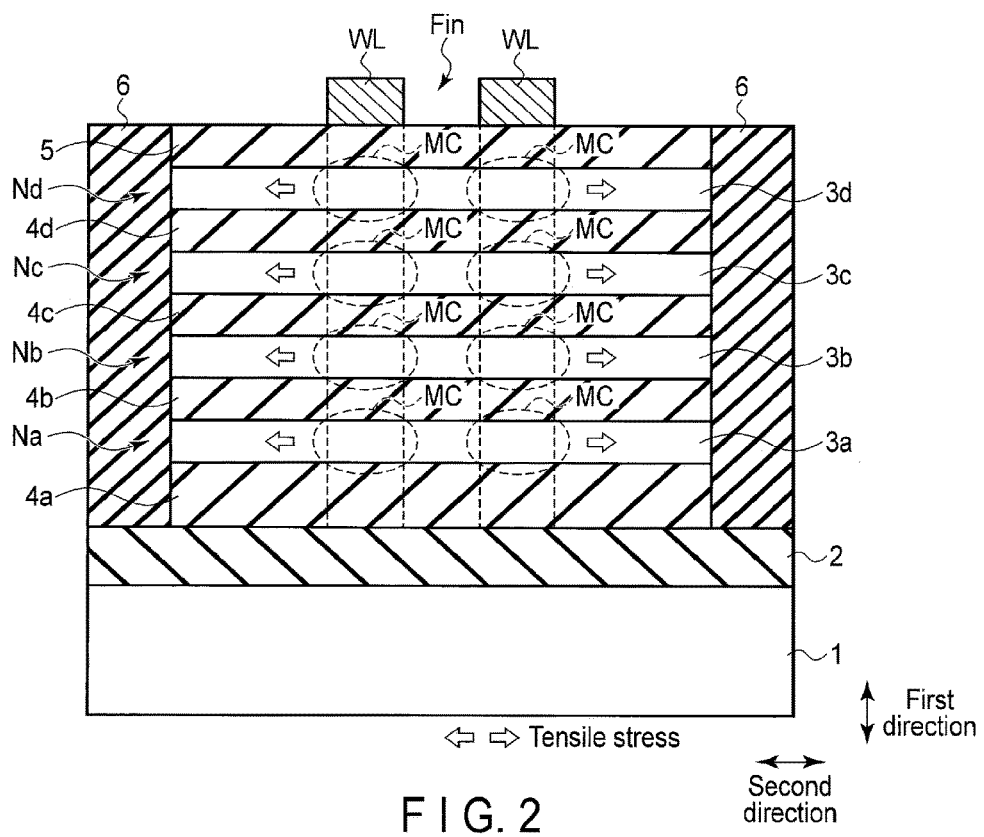
FIG. 2 is a sectional view along line II-II of FIG. 1.

FIG. 1 is a plan view showing a nonvolatile semiconductor memory device. FIG. 2 is a sectional view along line II-II of FIG. 1.

A semiconductor substrate 1 is, for example, a silicon substrate. An insulating layer 2 is, for example, a silicon oxide layer, and provided on the semiconductor substrate 1.

A first structure Fin is provided on the insulating layer 2. The first structure Fin comprises, for example, a plurality of (four in this example) semiconductor layers 3a, 3b, 3c, and 3d stacked in a first direction perpendicular to a surface of the semiconductor substrate 1. In addition, the first structure Fin extends in a second direction parallel to the surface of the semiconductor substrate 1.

The semiconductor layers 3a, 3b, 3c, and 3d are insulated from each other by, for example, insulating layers 4a, 4b, 4c, 4d, and 5.

It is preferable that in the first direction, the insulating layers 4a, 4b, 4c, and 4d be equal in thickness to each other. In addition, the insulating layer 5 as a top layer may function as a mask used when the first structure Fin is formed. In this case, it is preferable that in the first direction, the insulating layer 5 be thicker than the insulating layers 4a, 4b, 4c, and 4d.

In the present example, the four semiconductor layers 3a, 3b, 3c, and 3d are stacked. However, the number of semiconductor layers in the first structure Fin is not limited to this. To increase the memory capacity of the nonvolatile semiconductor memory device, it is preferable that the number of semiconductor layers in the first structure Fin be greater.

Memory cells MC are provided on surfaces of the semiconductor layers 3a, 3b, 3c, and 3d in a third direction crossing the first and second directions.

For example, cell units (memory strings) Na, Nb, Nc, and Nd are provided on the surfaces of the semiconductor layers 3a, 3b, 3c, and 3d in the third direction. Each of the cell units Na, Nb, Nc, and Nd comprises memory cells MC connected in series in the second direction.

In the present example, one cell unit includes two memory cells MC connected in series. However, the number of memory cells in one cell unit is not limited to this. The number of memory cells MC in one cell unit may be four, eight, sixteen, thirty-two, etc.

In addition, each of the cell units Na, Nb, Nc, and Nd may comprise two select transistors connected to both ends of the memory cells MC connected in series, respectively.

The memory cells MC have a field-effect transistor (FET) structure. For example, the memory cells MC each comprise a second structure on the surfaces of the semiconductor layers 3a, 3b, 3c, and 3d facing in the third direction. The second structure comprises, for example, a gate insulating layer (tunnel insulating layer), a charge storage layer, a block insulating layer, and a control gate electrode.

A word line WL functions as the control gate electrode.

The semiconductor layers 3a, 3b, 3c, and 3d function as channels of the memory cells MC. In this case, the semiconductor layers 3a, 3b, 3c, and 3d preferably have a single-crystal structure, but may have a polycrystalline structure, an amorphous structure, or the like.

If the semiconductor layers 3a, 3b, 3c, and 3d have a polycrystalline structure or an amorphous structure, and the width of the first structure Fin in the third direction becomes narrower because of the miniaturization of the memory cells MC, the channel resistance of the memory cells MC increases remarkably. As a result, the on-state current of the memory cells MC decreases.

If the thickness of the semiconductor layers 3a, 3b, 3c, and 3d in the first direction is, for example, increased to prevent this, the height of the first structure Fin in the first direction increases. This makes it hard to pattern the first structure Fin.

Thus, the present example proposes a technique of increasing an on-state current flowing through the memory cells MC by applying tensile stress to the semiconductor layers 3a, 3b, 3c, and 3d in the second direction (direction in which a channel current flows).

In an FET, if tensile stress is applied to a semiconductor layer as a channel in the direction in which a channel current flows, the on-state current of the channel FET increases regardless of the crystal structure (single-crystal/polycrystalline/amorphous), crystal orientation, and orientation of the semiconductor layer. However, the nonvolatile semiconductor memory device of the present example has a three-dimensional structure. That is, a device for applying tensile stress to the channels of the memory cells MC as FETs is required.

Therefore, in the present example, to apply tensile stress to the channels of the memory cells MC, volume expansion is caused in the insulating layers 4a, 4b, 4c, 4d, and 5 in a manufacturing process.

For example, if the insulating layers 4a, 4b, 4c, 4d, and 5 comprise silicon oxide, the insulating layers 4a, 4b, 4c, 4d, and 5 are changed into an oxygen-rich state by injecting oxygen atoms thereinto, and volume expansion is caused in the insulating layers 4a, 4b, 4c, 4d, and 5.

Here, the oxygen-rich state means a state in which more oxygen is included than in the stoichiometric mixture ratio ($SiO_2$) of oxygen in silicon oxide. For example, oxygen silicon in which the ratio of silicon to oxygen is 1:x (x is a number greater than two) is in the oxygen-rich state.

Oxygen atoms can be injected into the insulating layers 4a, 4b, 4c, 4d, and 5 by, for example, exposing them to an oxygen atmosphere. For example, if the gate insulating layers of the memory cells MC comprise silicon oxide, the gate insulating layers are formed by a thermal oxidation process in an oxygen atmosphere. Thus, for example, in the thermal oxidation process, oxygen atoms can be injected into the insulating layers 4a, 4b, 4c, 4d, and 5.

Figure 18:
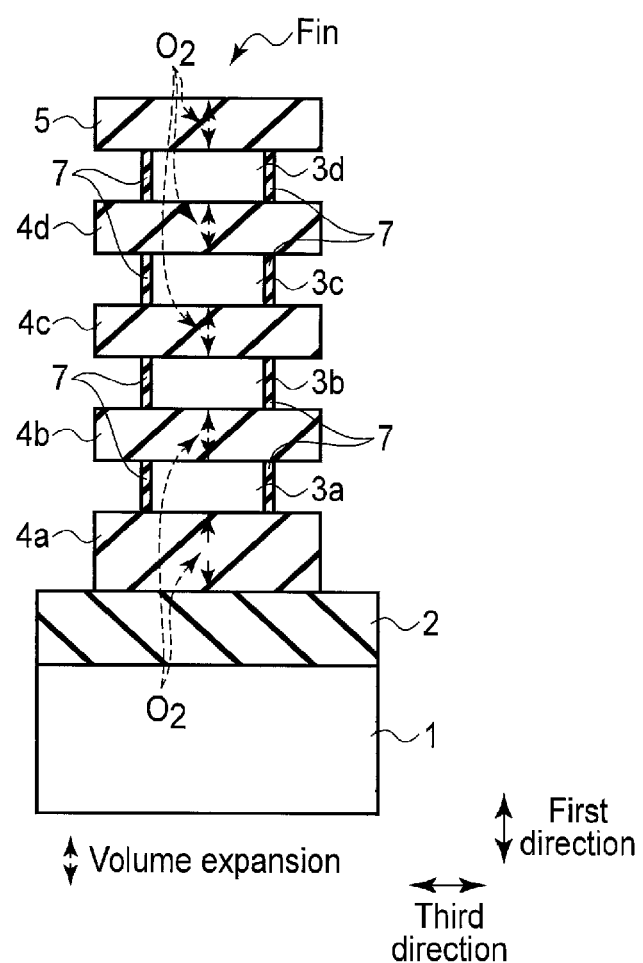
FIG. 18 is a sectional view along line XVIII-XVIII of FIG. 16.

When volume expansion occurs in the insulating layers 4a, 4b, 4c, 4d, and 5, the first structure Fin tries to extend in the first direction as shown in FIG. 16 to FIG. 18.

However, in the present example, there is provided an insulating layer 6 which contacts at least one of first and second end portions of the first structure Fin in the second direction and which does not cover at least a part of an area between the first and second end portions. The insulating layer 6 does not cover, for example, a central portion of the first structure Fin except for the first and second end portions (the same applies to the following embodiments).

The insulating layer 6 has a function as a supporter which prevents the extension of the first structure Fin in the first direction when the volumes of the insulating layers 4a, 4b, 4c, 4d, and 5 expand. In addition, the insulating layer 6 differs from an interlayer insulating layer covering the first structure Fin, because it does not cover the central portion of the first structure Fin.

In this case, the insulating layers 4a, 4b, 4c, 4d, and 5 cannot extend in the first direction because of the volume expansion, and thus, compress the semiconductor layers 3a, 3b, 3c, and 3d provided therebetween. Accordingly, tensile stress in the second direction (direction in which a channel current flows) is produced in the semiconductor layers 3a, 3b, 3c, and 3d.

The on-state current of the memory cells MC can be thereby increased.

In addition, the production of tensile stress in the semiconductor layers 3a, 3b, 3c, and 3d in the second direction brings about the following incidental advantage:

In a VG semiconductor memory structure, writing/erasing of data is executed by the movement of charges between the semiconductor layers 3a, 3b, 3c, and 3d as channels and the charge storage layers of the memory cells MC. However, if writing/erasing is repeated, damage (a defect) occurs in the gate insulating layers (tunnel insulating layers) of the memory cells MC, and the charges are trapped by the damage. The charges trapped in the gate insulating layers cause a threshold voltage of the memory cells MC to fluctuate in the reading of data from the memory cells MC. In addition, in the reading, when the charges are detrapped, a channel current thereby fluctuates. These phenomena cause a read disturbance, a read error, etc.

However, if tensile stress is produced in the semiconductor layers 3a, 3b, 3c, and 3d in the second direction, a band structure between the semiconductor layers 3a, 3b, 3c, and 3d and the insulating layers 4a, 4b, 4c, 4d, and 5 changes, and it becomes hard for such trapping/detrapping of charges to occur. A read disturbance, a read error, etc., are thereby prevented, and read performance can be improved.

The insulating layer 6 preferably comprises, for example, silicon nitride and silicon carbide, to effectively exercise a function as a supporter preventing the extension of the first structure Fin in the first direction.

It should be noted that if tensile stress is produced in the semiconductor layers 3a, 3b, 3c, and 3d in the second direction as shown in FIG. 3, a lattice spacing b of semiconductor atoms in the semiconductor layers 3a, 3b, 3c, and 3d in the second direction becomes larger than a lattice spacing c of the semiconductor atoms in the semiconductor layers 3a, 3b, 3c, and 3d in the first direction.

In addition, for example, if the semiconductor substrate 1 and the semiconductor layers 3a, 3b, 3c, and 3d include silicon atoms, the lattice spacing b of the silicon atoms in the semiconductor layers 3a, 3b, 3c, and 3d in the second direction is larger than a lattice spacing a of the silicon atoms in the semiconductor substrate 1, and the lattice spacing c of the silicon atoms in the semiconductor layers 3a, 3b, 3c, and 3d in the first direction is smaller than the lattice spacing a of the silicon atoms in the semiconductor substrate 1.

In the present example, the insulating layer 6 contacts both ends (first and second end portions) of the first structure Fin in the second direction. That is, the insulating layer 6 supports the first structure Fin at both ends in the second direction to prevent the first structure Fin from extending in the first direction when the volumes of the insulating layers 4a, 4b, 4c, 4d, and 5 expand.

However, the insulating layer 6 may contact only one end (first or second end portion) of the first structure Fin in the second direction.

Second Embodiment

The second embodiment is an embodiment of the structure of memory cells in the first embodiment.

VG semiconductor memory structures are broadly classified into two types by the structure of memory cells. One is a vertical gate-floating gate (VG-FG) type in which a conductive layer in an electrically floating state (floating gate electrode) is used as a charge storage layer. The other is a vertical gate-silicon/oxide/nitride/oxide/silicon (VG-SONOS) type in which an insulating layer trapping charges (charge trap layer) is used as a charge storage layer.

Both types are characterized by comprising a gate stacked structure (memory cells) in which a gate insulating layer, a charge storage layer, a block insulating layer (IPD layer), and a control gate electrode are stacked in this order on a side surface of a semiconductor layer (channel) on a semiconductor substrate.

(1) Structure

FIG. 4 is a perspective view of the nonvolatile semiconductor memory device.

The present example is an example in which memory cells MC are the VG-FG type. Elements other than the memory cells MC are the same as those of the first embodiment (FIG. 1 and FIG. 2). Therefore, the same elements as those of the first embodiment are given the same numbers, and thus, detailed explanations thereof are omitted.

Cell units (memory strings) Na, Nb, Nc, and Nd are provided on surfaces of semiconductor layers 3a, 3b, 3c, and 3d in the third direction. Each of the cell units Na, Nb, Nc, and Nd comprises memory cells MC connected in series in the second direction.

The memory cells MC each comprise a second structure on the surfaces of the semiconductor layers 3a, 3b, 3c, and 3d facing in the third direction. The second structure comprises, for example, a gate insulating layer (tunnel insulating layer) 7, a charge storage layer (conductive layer in an electrically floating state) 8, a block insulating layer 9, and a control gate electrode 10.

A word line WL functions as the control gate electrode 10.

In the memory cells MC of the present example, the control gate electrode 10 covers a part of a surface of the charge storage layer 8 in the first direction. Through this structure, the coupling ratio of the memory cells MC can be improved.

FIG. 5 is a perspective view of the nonvolatile semiconductor memory device.

The present example is a modification of the memory cells of FIG. 4. Elements other than the memory cells MC are the same as those of the first embodiment (FIG. 1 and FIG. 2). Therefore, the same elements as those of the first embodiment are given the same numbers, and thus, detailed explanations thereof are omitted.

In the memory cells MC of the present example, the control gate electrode 10 covers only a surface of the charge storage layer 8 in the third direction.

Through this structure, the block insulating layer 9 to be an underlayer of the control gate electrode 10 becomes smooth, and thus, a leak current which is produced in the block insulating layer 9 at the time of reading/writing can be reduced. In addition, the patterning of the control gate electrode 10 can be facilitated.

FIG. 6 is a perspective view of the nonvolatile semiconductor memory device.

The present example is an example in which the memory cells MC are the VG-SONOS type. Elements other than the memory cells MC are the same as those of the first embodiment (FIG. 1 and FIG. 2). Therefore, the same elements as those of the first embodiment are given the same numbers, and thus, detailed explanations thereof are omitted.

The cell units (memory strings) Na, Nb, Nc, and Nd are provided on the surfaces of the semiconductor layers 3a, 3b, 3c, and 3d in the third direction. Each of the cell units Na, Nb, Nc, and Nd comprises the memory cells MC connected in series in the second direction.

The memory cells MC comprise the second structure on the surfaces of the semiconductor layers 3a, 3b, 3c, and 3d facing in the third direction. The second structure comprises, for example, the gate insulating layer (tunnel insulating layer) 7, the charge storage layer (insulating layer trapping charges) 8, the block insulating layer 9, and the control gate electrode 10.

The word line WL functions as the control gate electrode 10.

In the present example, the memory cells MC which share the control gate electrode 10 also share the charge storage layer 8. Even in this structure, charges (data) in the charge storage layers 8 of the memory cells MC are not confused, because the charge storage layers 8 are a charge trapping type.

In addition, because an isolation process of the charge storage layers 8 is unnecessary, a manufacturing process is facilitated.

(2) Examples of Materials

Next, examples of materials constituting each element of the structure of FIG. 4 to FIG. 6 will be described.

As the materials constituting the nonvolatile semiconductor memory device, the optimum materials can be selected as appropriate according to the respective generations of semiconductor memories. In the following description, the most frequently used examples of materials will be given.

The semiconductor layers 3a, 3b, 3c, and 3d are, for example, silicon layers. The silicon layers are preferably in a single-crystal state, but may be in a polycrystalline state, an amorphous state, or the like. In addition, the semiconductor layers 3a, 3b, 3c, and 3d may be, for example, layers of a semiconductor such as Ge, or layers of a compound semiconductor such as SiGe.

The insulating layers 2, 4a, 4b, 4c, 4d, and 5 are, for example, silicon oxide layers. The insulating layers 2, 4a, 4b, 4c, 4d, and 5 may have a stacked structure including, for example, a silicon oxide layer and a silicon nitride layer.

The insulating layer 5 may comprise a material different from those of the insulating layers 2, 4a, 4b, 4c, and 4d, for example, an aluminum nitride layer in order to function as a hard mask layer.

The gate insulating layer 7 and the block insulating layer 9 are, for example, silicon oxide layers or silicon nitride layers. The gate insulating layer 7 and the block insulating layer 9 can be silicon oxynitride layers, a combination of a silicon oxide layer and a silicon nitride layer, or the like.

The gate insulating layer 7 and the block insulating layer 9 may be hafnium oxide layers ($HfO_2$), zirconium oxide (ZrO), aluminum oxide layers ($Al_2O_3$), lanthanum aluminum oxide ($LaAlO_3$), lanthanum aluminum silicon oxide (LaAlSiO), aluminum oxynitride (AlON), hafnium oxide ($HfO_2$), hafnium aluminate ($HfAlO_3$), hafnium oxynitride (HfON), hafnium aluminate nitride (HfAlON), hafnium silicate (HfSiO), hafnium silicate nitride (HfSiON), lanthanum oxide ($La_2O_3$), lanthanum aluminate ($LaAlO_3$), lanthanum aluminosilicate (LaAlSiO), materials obtained by changing these composition ratios, or the like.

The gate insulating layer 7 and the block insulating layer 9 may include silicon nanoparticles, metal ions, or the like.

The control gate electrode 10 generally includes, for example, a conductive silicon layer. It should be noted that the optimum materials can be selected as appropriate according to the respective generations of semiconductor memories under the condition that patterning can be performed.

For example, the control gate electrode 10 comprises a metallic compound such as tantalum nitride (TaN), tantalum carbide (TaC), or titanium nitride (TiN). In addition, the control gate electrode 10 may be V, Cr, Mn, Y, Mo, Ru, Rh, Hf, Ta, W, Ir, Co, Ti, Er, Pt, Pd, Zr, Gd, Dy, Ho, or a silicide of these, which exhibits the electrically conductive properties of metals.

If the charge storage layer 8 is a conductive layer in an electrically floating state, the charge storage layer 8 generally includes, for example, a conductive silicon layer. It should be noted that the optimum materials can be selected as appropriate according to the respective generations of semiconductor memories under the condition that patterning can be performed.

In addition, the charge storage layer 8 may be a metallic compound such as tantalum nitride (TaN), tantalum carbide (TaC), or titanium nitride (TiN). Moreover, the charge storage layer 8 may be V, Cr, Mn, Y, Mo, Ru, Rh, Hf, Ta, W, Ir, Co, Ti, Er, Pt, Pd, Zr, Gd, Dy, Ho, or a silicide of these, which exhibits the electrically conductive properties of metals.

The charge storage layer 8 may include the same material as that of the control gate electrode 10, or a material different from that of the control gate electrode 10.

If the charge storage layer 8 is an insulating layer trapping charges, the charge storage layer 8 comprises, for example, a silicon nitride film ($Si_3N_4$), or a material obtained by changing the composition ratio of silicon to nitrogen, which are elements constituting the silicon nitride film. In addition, the charge storage layer 8 may be silicon oxynitride (SiON), aluminum oxide ($Al_2O_3$), aluminum oxynitride (AlON), hafnium oxide ($HfO_2$), hafnium aluminate ($HfAlO_3$), hafnium oxynitride (HfON), hafnium aluminate nitride (HfAlON), hafnium silicate (HfSiO), hafnium silicate nitride (HfSiON), lanthanum oxide ($La_2O_3$), lanthanum aluminate ($LaAlO_3$), or the like.

(3) Manufacturing Method

An example of a method of manufacturing the structure of FIG. 4 will be described.

First, as shown in FIG. 7 and FIG. 8, for example, a first-conductive-type (for example, p-type) semiconductor substrate (for example, silicon substrate) 1 having a plane direction (100) and specific resistance of 10 to 20 Ω-cm is prepared. On the semiconductor substrate 1, a stacked structure including the insulating layer (for example, silicon oxide layer) 2, the insulating layers (for example, silicon oxide layers) 4a, 4b, 4c, 4d, and 5, and the semiconductor layers (for example, polycrystalline silicon layers) 3a, 3b, 3c, and 3d is formed.

Then, an opening is formed in the stacked structure by a photo-engraving process (PEP). In addition, for example, the opening is filled with an insulating layer 6 using LPCVD and CMP. The insulating layer 6 is, for example, a silicon nitride layer or a silicon carbide layer.

Next, a mask layer 11 is formed by PEP as shown in FIG. 9 and FIG. 10. Then, the above-described stacked structure is patterned by RIE with the mask layer 11 used as a mask. As a result, the first structure (fin structure) Fin, one end of which in the second direction contacts the insulating layer 6, is formed as shown in FIG. 11, FIG. 12, and FIG. 13.

Next, as shown in FIG. 14, the semiconductor layers 3a, 3b, 3c, and 3d are each selectively shrunk by, for example, wet etching. That is, each of the widths of the semiconductor layers 3a, 3b, 3c, and 3d in the third direction is narrower than those of the insulating layers 4a, 4b, 4c, 4d, and 5 in the third direction.

Next, as shown in FIG. 15, the gate insulating layers (for example, silicon oxide layers) 7 are formed on the surfaces of the semiconductor layers 3a, 3b, 3c, and 3d, respectively, in the third direction by, for example, performing thermal oxidation in an oxygen atmosphere.

At this time, as shown in FIG. 16, FIG. 17, and FIG. 18, tensile stress is produced in the semiconductor layers 3a, 3b, 3c, and 3d in the second direction.

That is, oxygen atoms are injected into the insulating layers 4a, 4b, 4c, 4d, and 5 by the thermal oxidation, the insulating layers 4a, 4b, 4c, 4d, and 5 change into an oxygen-rich state, and volume expansion occurs. However, since the extension of the first structure Fin in the first direction is prevented by the insulating layer 6 as a supporter, the volume expansion of the insulating layers 4a, 4b, 4c, 4d, and 5 is converted into force compressing the semiconductor layers 3a, 3b, 3c, and 3d in the first direction.

Accordingly, tensile stress is produced in the semiconductor layers 3a, 3b, 3c, and 3d in the second direction. This causes a change in a band structure, effective mass, etc., in the semiconductor layers 3a, 3b, 3c, and 3d, and the on-state current of the memory cells with the semiconductor layers 3a, 3b, 3c, and 3d as channels can be increased.

Figure 19:
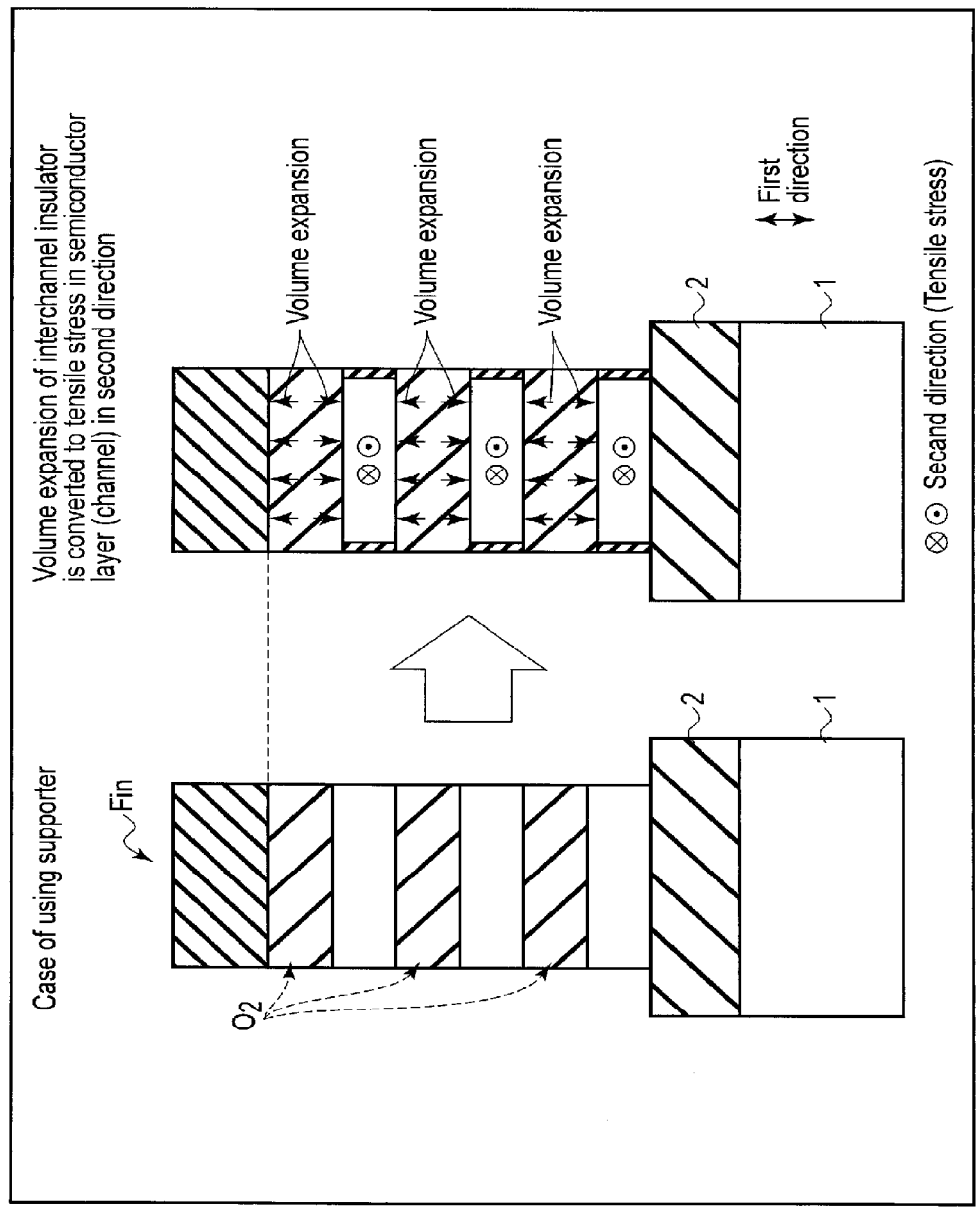
FIG. 19 is a sectional view showing an example in which volume expansion is converted to tensile stress.

In addition, as shown in FIG. 19, in the present example, since the first structure Fin is supported by the insulating layer 6 as a supporter. Thus, the extension of the first structure Fin in the first direction due to thermal oxidation can be prevented. That is, the height of the first structure Fin in the first direction does not substantially change before or after thermal oxidation.

Figure 20:
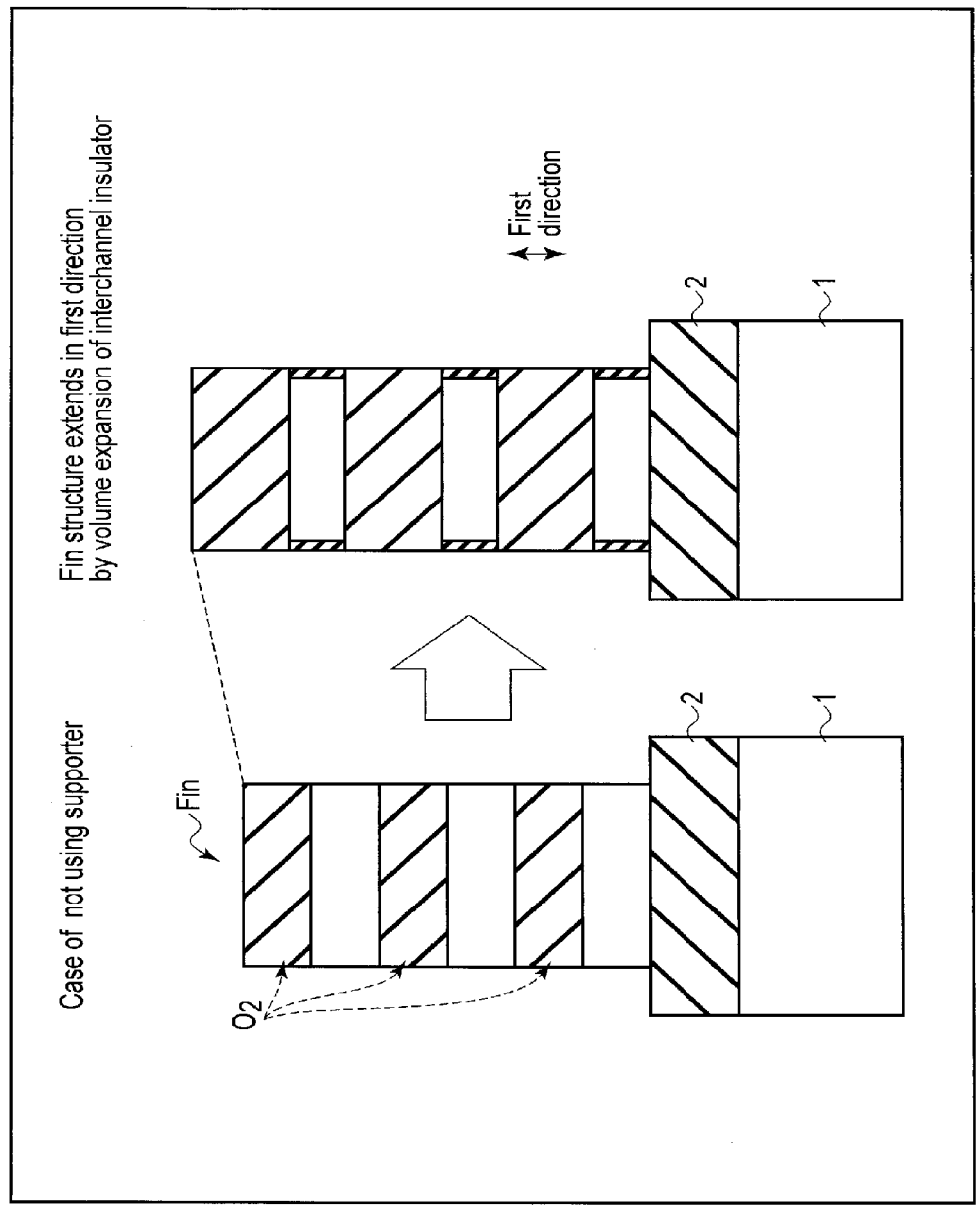
FIG. 20 is a sectional view showing an example in which volume expansion increases the height of a fin structure.

In contrast, as shown in FIG. 20, in a comparative example not including the insulating layer 6 as a supporter, the first structure Fin extends in the first direction by thermal oxidation. That is, because oxygen atoms are injected into insulating layers by the thermal oxidation, the height of the first structure in the first direction is greater after the thermal oxidation than before the thermal oxidation.

In addition, because of the thermal oxidation, the surfaces of the semiconductor layers in the first direction are also oxidized at the same time as the formation of gate insulating layers. Thus, the semiconductor layers become thinner, and the insulating layers become thicker. That is, the ratio of the thickness of the semiconductor layers to that of the insulating layers varies.

It should be noted that to make the above advantage of producing tensile stress effective, the insulating layer 6 is preferably a material in which volume expansion does not occur because of thermal oxidation in an oxygen atmosphere, for example, a silicon nitride layer or a silicon carbide layer.

Next, as shown in FIG. 21, a conductive layer (for example, a doped polycrystalline layer) 8' covering the first structure Fin is formed. In addition, by etching the conductive layer 8' by RIE, the conductive layer 8' is left only in depressions between the insulating layers 4a, 4b, 4c, 4d, and 5.

As a result, as shown in FIG. 22, the charge storage layers (floating gate electrodes) 8 electrically isolated from each other are formed in the depressions between the insulating layers 4a, 4b, 4c, 4d, and 5.

Next, as shown in FIG. 23, the insulating layers 4a, 4b, 4c, 4d, and 5 are each selectively shrunk by, for example, wet etching. That is, each of the surfaces of the insulating layers 4a, 4b, 4c, 4d, and 5 in the third direction is located further inward than those of the charge storage layers 8 exposed in the third direction.

Finally, as shown in FIG. 24, FIG. 25, and FIG. 26, the block insulating layer 9 and the control gate electrode 10 covering the first structure Fin are formed. In addition, the word line WL extending over the first structure Fin is formed by patterning the control gate electrode 10 by, for example, PEP and RIE.

By the above steps, the structure of FIG. 4 can be obtained.

Third Embodiment

The third embodiment relates to the layout of first structures (fin structures) Fin in the first and second embodiments. In the following description, first structures Fin correspond to the first structures Fin in the first and second embodiments, and insulating layers 6 correspond to the insulating layers 6 in the first and second embodiments.

FIG. 27 shows a first example of the layout of the nonvolatile semiconductor memory device.

A plurality of (five in the present example) first structures Fin each extend in the second direction crossing the first direction, and are arranged in the third direction crossing the first and second directions.

A second structure 12-1 as a beam contacts first end portions of the first structures Fin in the second direction, and comprises the same layers as those of the first structures. The second structure 12-1 functions as a drain area (D) of cell units.

An insulating layer 6 as a supporter contacts a surface of the second structure 12-1 facing in the second direction, and does not cover the first structures Fin.

In addition, a second structure 12-2 as a beam contacts second end portions of the first structures Fin in the second direction, and comprises the same layers as those of the first structures. The second structure 12-2 functions as a source area (S) of the cell units.

An insulating layer 6 as a supporter contacts a surface of the second structure 12-2 facing in the second direction, and does not cover the first structures Fin.

Through this layout, tensile stress can be efficiently applied to semiconductor layers in the first structures Fin.

It should be noted that one of the insulating layer 6 contacting the second structure 12-1 and the insulating layer 6 contacting the second structure 12-2 may be omitted.

FIG. 28 shows a second example of the layout of the nonvolatile semiconductor memory device.

The second example differs from the first example in the layout of source areas (S) and drain areas (D).

In the second example, of the first structures Fin, first structures Fin that are odd-numbered from the left end use the second structure 12-1 as drain areas (D), and first structures Fin that are even-numbered from the left end use the second structure 12-2 as drain areas (D).

In this layout, sources areas (S) of the first structures Fin that are odd-numbered from the left end are physically combined with the second structure 12-2, but are electrically isolated from the drain areas (D) in the second structure 12-2.

In addition, source areas (S) of the first structures Fin that are even-numbered from the left end are physically connected to the second structure 12-1, but are electrically isolated from the drain areas (D) in the second structure 12-1.

Also in this layout, tensile stress can be efficiently applied to the semiconductor layers in the first structures Fin.

It should be noted that one of the insulating layer 6 contacting the second structure 12-1 and the insulating layer 6 contacting the second structure 12-2 may be omitted.

FIG. 29 shows a third example of the layout of the nonvolatile semiconductor memory device.

The third example differs from the first example in the layout of source areas (S) and drain areas (D).

In the third example, the second structures 12-1 and 12-2 both function as drain areas (D). In this case, sources areas (S) are provided at central portions of the first structures Fin.

Also in this layout, tensile stress can be efficiently applied to the semiconductor layers in the first structures Fin.

It should be noted that one of the insulating layer 6 contacting the second structure 12-1 and the insulating layer 6 contacting the second structure 12-2 may be omitted.

FIG. 30 shows a fourth example of the layout of the nonvolatile semiconductor memory device.

In comparison with the first example, the fourth example is characterized in that the second structure 12-2 of FIG. 27, which combines the second end portions of the first structures Fin with each other, does not exist.

That is, on the source area (S) sides of the first structures Fin, the insulating layer 6 as a supporter contacts the second end portions of the first structures Fin, and does not cover the central portions of the first structures Fin.

Also in this layout, tensile stress can be efficiently applied to the semiconductor layers in the first structures Fin.

It should be noted that one of the insulating layer 6 contacting the second structure 12-1 and the insulating layer 6 contacting the second end portions on the source area (S) sides of the first structures Fin may be omitted.

FIG. 31 shows a fifth example of the layout of the nonvolatile semiconductor memory device.

In comparison with the first example, the fifth example is characterized in that the second structure 12-1 of FIG. 27, which combines the first end portions of the first structures Fin with each other, does not exist.

That is, on the drain area (D) sides of the first structures Fin, the insulating layer 6 as a supporter contacts the first end portions of the first structures Fin, and does not cover the central portions of the first structures Fin.

Also in this layout, tensile stress can be efficiently applied to the semiconductor layers in the first structures Fin.

It should be noted that one of the insulating layer 6 contacting the second structure 12-2 and the insulating layer 6 contacting the first end portions on the drain area (D) sides of the first structures Fin may be omitted.

Figure 32:
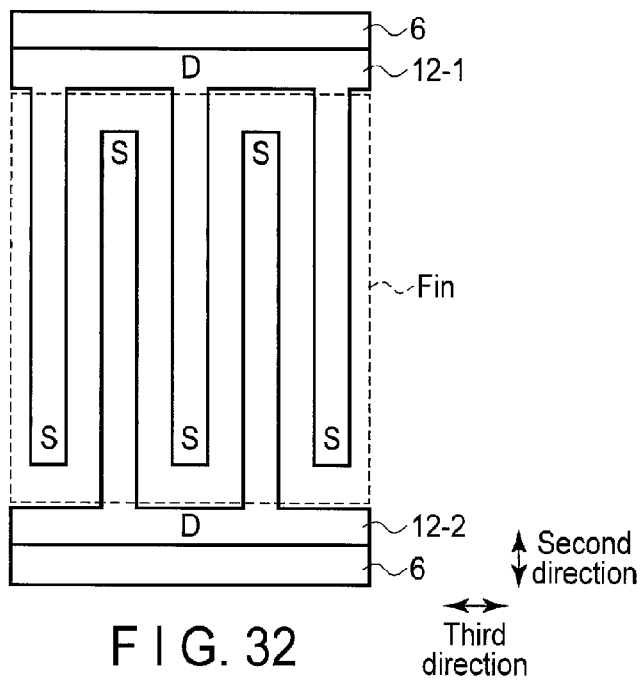

FIG. 32 shows a sixth example of the layout of the nonvolatile semiconductor memory device.

In comparison with the first example, the sixth example is characterized in that the second structures 12-1 and 12-2 are both drain areas (D), and sources areas (S) are physically isolated from the second structures 12-1 and 12-2.

In the sixth example, of the first structures Fin, first structures Fin that are odd-numbered from the left end use the second structure 12-1 as a drain area (D), and first structures Fin that are even-numbered from the left end use the second structure 12-2 as a drain area (D).

The source areas (S) of the first structures Fin that are odd-numbered from the left end are physically isolated from the second structure 12-2. In addition, the source areas (S) of the first structures Fin that are even-numbered from the left end are physically isolated from the second structure 12-1.

Also in this layout, tensile stress can be efficiently applied to the semiconductor layers in the first structures Fin.

It should be noted that one of the insulating layer 6 contacting the second structure 12-1 and the insulating layer 6 contacting the second structure 12-2 may be omitted.

Figure 33:
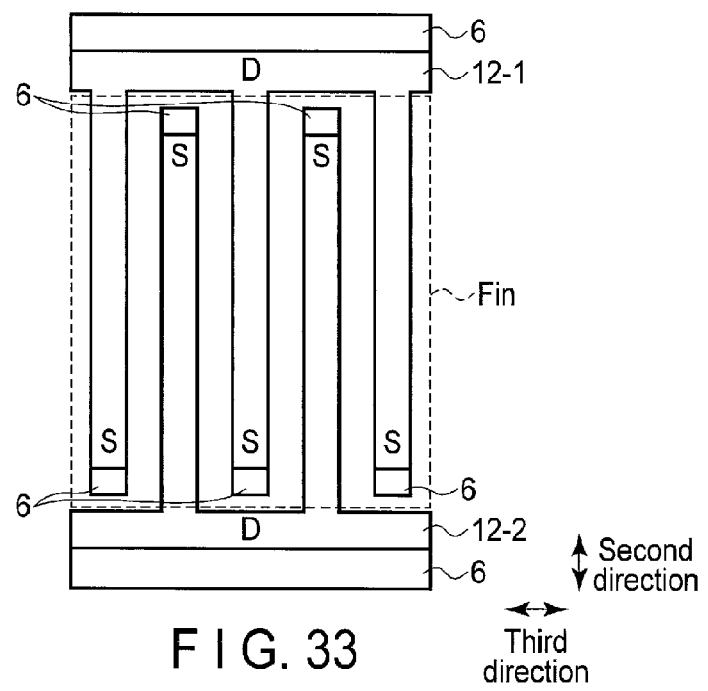

FIG. 33 shows a seventh example of the layout of the nonvolatile semiconductor memory device.

The seventh example includes the characteristics of the sixth example. In comparison with the sixth example, the seventh example is further characterized in that insulating layers 6 as supporters contact end portions on the source area (S) sides of the first structures Fin.

Also in this layout, tensile stress can be efficiently applied to the semiconductor layers in the first structures Fin.

It should be noted that one of the insulating layer 6 contacting the second structure 12-1, the insulating layer 6 contacting the second structure 12-2, and the insulating layers 6 contacting the end portions on the source area (S) sides of the first structures Fin may be omitted.

FIG. 34 shows an eighth example of the layout of the nonvolatile semiconductor memory device.

The eighth example includes the characteristics of the seventh example. In comparison with the seventh example, the eighth example is further characterized in that the insulating layers 6 on the source area (S) sides of the first structures Fin cover parts of the surfaces of the first structures Fin in the third direction.

Also in this layout, tensile stress can be efficiently applied to the semiconductor layers in the first structures Fin.

It should be noted that one of the insulating layer 6 contacting the second structure 12-1, the insulating layer 6 contacting the second structure 12-2, and the insulating layers 6 contacting the end portions on the source area (S) sides of the first structures Fin may be omitted.

FIG. 35 shows a ninth example of the layout of the nonvolatile semiconductor memory device.

A plurality of (four in the present example) first structures Fin each extend in the second direction crossing the first direction, and are arranged in the third direction crossing the first and second directions.

The first structures Fin are paired, and each pair shares a source area (S). The source area (S) shared by two first structures Fin functions as a second structure as a beam. Drain areas (D) are provided at the central portions of the first structures Fin.

Insulating layers 6 as supporters are provided around the source areas (S), and contact the source areas (S).

Also in this layout, tensile stress can be efficiently applied to the semiconductor layers in the first structures Fin.

It should be noted that the insulating layers 6 may contact parts of the source areas (S). That is, to facilitate the patterning of the insulating layers 6 and prevent misalignment between the insulating layers 6 and the first structures Fin, the insulating layers 6 may be provided, for example, only between the paired first structures Fin.

Application Examples

The case where the above-described first to third embodiments are applied to, for example, a vertical gate ladder-bit cost-scalable memory (VLB) will be described.

Figure 36:
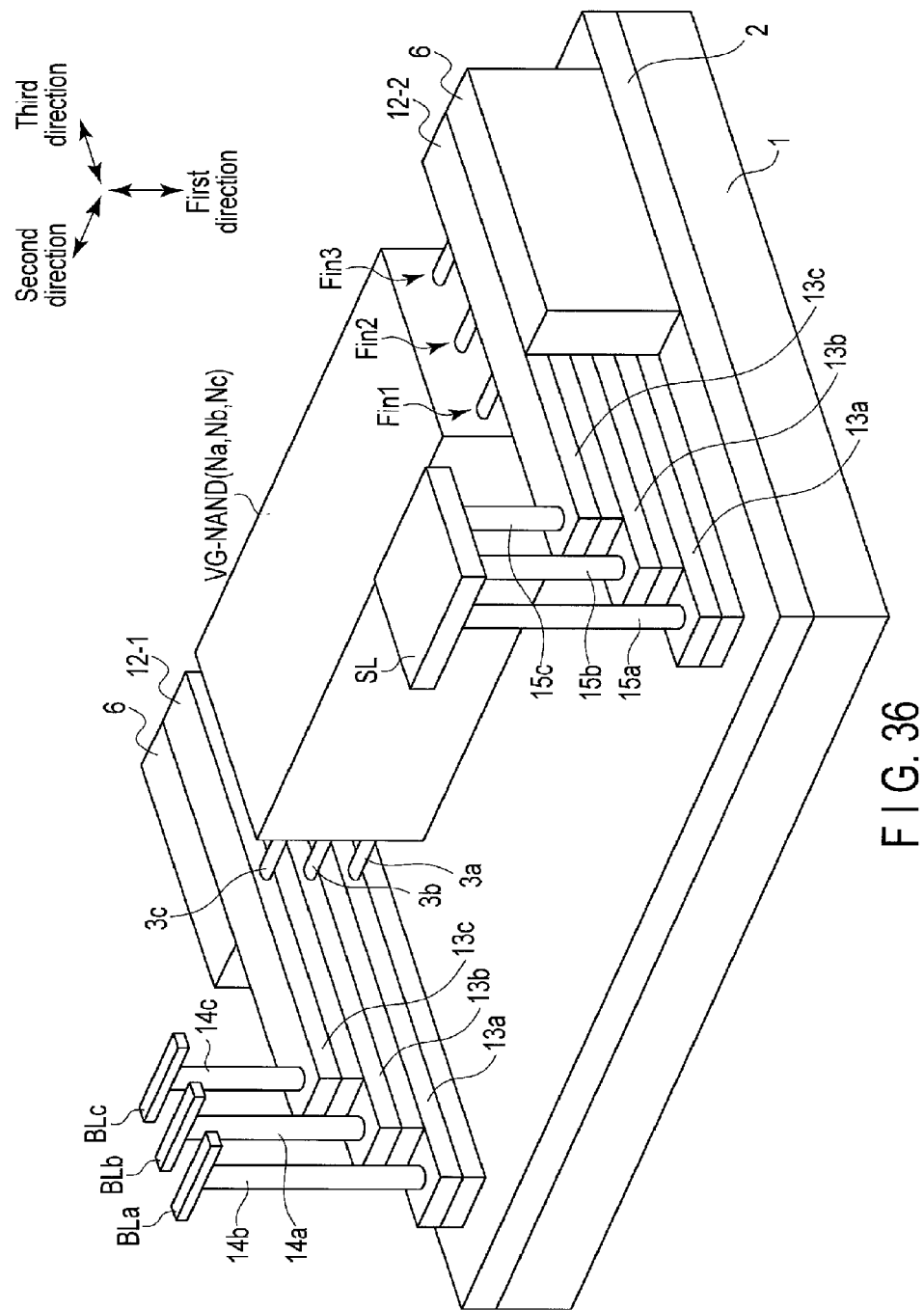
FIG. 36 and FIG. 37 are perspective views showing application examples of the nonvolatile semiconductor memory device.
Figure 37:
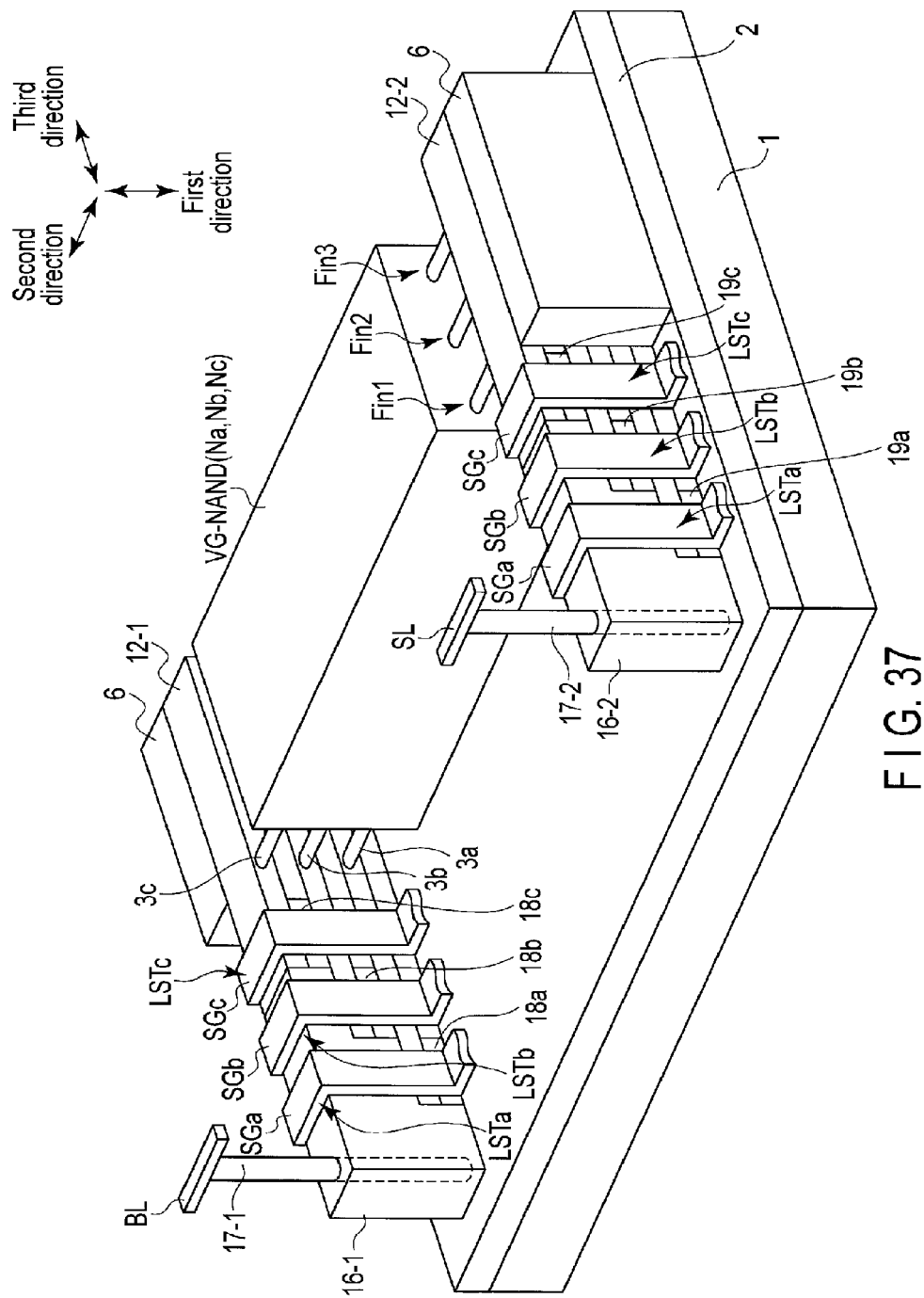

FIG. 36 and FIG. 37 are perspective views of the VLB.

First structures (fin structures) Fin1, Fin2, and Fin3 each comprise semiconductor layers 3*a*, 3*b*, and 3*c*. Although the number of stacked semiconductor layers is four in the above-described first to third embodiments, the number of stacked semiconductor layers is three in the present example.

A vertical gate (VG) NAND memory includes cell units (memory strings) Na, Nb, and Nc explained in the above-described first to third embodiments.

Both ends of the first structures Fin1, Fin2, and Fin3 in the second direction are connected to second structures 12-1 and 12-2 as beams extending in the third direction. The second structures 12-1 and 12-2 comprise semiconductor layers 3*a*, 3*b*, and 3*c* like the first structures Fin1, Fin2, and Fin3.

It should be noted that the semiconductor layers 3*a*, 3*b*, and 3*c* in the second structures 12-1 and 12-2 comprise impurity areas 13*a*, 13*b*, and 13*c* to reduce resistance.

End portions of the second structures 12-1 and 12-2 in the third direction have the function of selecting one of the cell units Na, Nb, and Nc.

For example, in the example of FIG. 36, the end portions of the second structures 12-1 and 12-2 in the third direction have the shape of stairs. In addition, bit lines BLa, BLb, and BLc are independently connected to active areas 3*a*, 3*b*, and 3*c* in the second structure 12-2 via contact plugs 14*a*, 14*b*, and 14*c*, respectively. A source line SL is independently connected to active areas 3a, 3b, and 3c in the second structure 12-2 via contact plugs 15a, 15b, and 15c, respectively.

In addition, in the example of FIG. 37, the end portions of the second structures 12-1 and 12-2 in the third direction comprise common semiconductor layers 16-1 and 16-2 connected to the active areas 3a, 3b, and 3c in common and layer select transistors LSTa, LSTb, and LSTc.

A bit line BL is connected to the common semiconductor layer 16-1 via a contact plug 17-1, and a source line SL is connected to the common semiconductor layer 16-2 via a contact plug 17-2.

The layer select transistors LSTa, LSTb, and LSTc comprise select gate electrodes SGa, SGb, and SGc, respectively.

The layer select transistor LSTa comprises an impurity area 18a in an active area 3a as a bottom layer covered by the select gate electrode SGa. The layer select transistor LSTb comprises an impurity area 18b in an active area 3b as an intermediate layer covered by the select gate electrode SGb. The layer select transistor LSTc comprises an impurity area 18c in an active area 3c as a top layer covered by the select gate electrode SGc.

One of the cell units Na, Nb, and Nc (one semiconductor layer in the first structures Fin1, Fin2, and Fin3) can be thereby selected.

CONCLUSION

As described above, according to the embodiments, an on-state current of memory cells can be improved in a three-dimensional nonvolatile semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a first structure including a first insulating layer, a semiconductor layer, and a second insulating layer stacked in this order in a first direction, the first structure extending in a second direction crossing the first direction;
memory cells provided on a surface of the semiconductor layer facing in a third direction crossing the first and second directions, and connected in series in the second direction; and
a third insulating layer contacting at least one of first and second end portions of the first structure in the second direction and not covering at least a part of an area between the first and second end portions,
wherein a lattice spacing of semiconductor atoms in the semiconductor layer in the second direction is larger than a lattice spacing of the semiconductor atoms in the semiconductor layer in the first direction.

2. The device of claim 1, wherein
each of the memory cells comprises a second structure including a fourth insulating layer, a charge storage layer, a fifth insulating layer, and an electrode provided in this order on the surface of the semiconductor layer facing in the third direction.

3. The device of claim 1, wherein
each of the first and second insulating layers comprises silicon oxide in which a ratio of silicon to oxygen is 1:x, where x is a number greater than 2.

4. The device of claim 1, wherein
the third insulating layer covers a surface of the first structure facing in the second direction and does not cover a surface of the first structure facing in the third direction.

5. The device of claim 1, wherein
the third insulating layer covers a surface of the first structure facing in the second direction and covers a part of a surface of the first structure facing in the third direction.

6. The device of claim 1, further comprising
a semiconductor substrate having a surface, the first structure being provided on the surface,
wherein the first direction is a direction perpendicular to the surface, and
the second and third directions are directions parallel to the surface.

7. The device of claim 6, wherein
the semiconductor substrate and the semiconductor layer include silicon atoms,
a lattice spacing of the silicon atoms in the semiconductor layer is larger than a lattice spacing of the silicon atoms in the semiconductor substrate in the second direction, and
the lattice spacing of the silicon atoms in the semiconductor layer is smaller than the lattice spacing of the silicon atoms in the semiconductor substrate in the first direction.

* * * * *